US012602526B2

(12) United States Patent
Li et al.

(10) Patent No.: US 12,602,526 B2
(45) Date of Patent: Apr. 14, 2026

(54) BATTERY DESIGN OPTIMIZATION

(71) Applicant: Addionics IL Ltd, Tel-Aviv Yaffo (IL)

(72) Inventors: Xiang Li, London (GB); Hicham Machrouki, London (GB); Vladimir Yufit, London (GB); Farid Tariq, London (GB)

(73) Assignee: Addionics IL Ltd, Tel-Aviv Yaffo (IL)

( * ) Notice: Subject to any disclaimer, the term of this patent is extended or adjusted under 35 U.S.C. 154(b) by 385 days.

(21) Appl. No.: 18/212,758

(22) Filed: Jun. 22, 2023

(65) Prior Publication Data

US 2024/0426918 A1 Dec. 26, 2024

(51) Int. Cl.
G06F 30/27 (2020.01)
G01R 31/367 (2019.01)
G01R 31/389 (2019.01)

(52) U.S. Cl.
CPC ........... G06F 30/27 (2020.01); G01R 31/367 (2019.01); G01R 31/389 (2019.01)

(58) Field of Classification Search
CPC ...... G06F 30/27; G01R 31/367; G01R 31/389
See application file for complete search history.

(56) References Cited

U.S. PATENT DOCUMENTS

| | | |
|---|---|---|
| 2020/0272703 A1 | 8/2020 | Kim |
| 2021/0157959 A1 | 5/2021 | Miyamoto |
| 2021/0319152 A1 | 10/2021 | Couture et al. |
| 2023/0259757 A1* | 8/2023 | Margolin ........... G06Q 30/0601 |
| | | 706/21 |
| 2023/0316380 A1* | 10/2023 | Vasavada ........... G06Q 30/0631 |
| | | 705/26.7 |
| 2024/0169129 A1* | 5/2024 | Cobb ....................... G06F 30/27 |
| 2024/0222641 A1* | 7/2024 | Jahnke ................ H01M 4/1391 |

FOREIGN PATENT DOCUMENTS

| | | | |
|---|---|---|---|
| CN | 112446165 | 3/2021 | |
| CN | 112989574 | 6/2021 | |
| CN | 112989574 A * | 6/2021 | ............. G06F 30/27 |

(Continued)

OTHER PUBLICATIONS

Takagishi et al., "Machine Learning Approaches for Designing Mesoscale Structure of Li-Ion Battery Electrodes" Batteries 2019, 5, 54 (Year: 2019).*

(Continued)

*Primary Examiner* — John C Kuan
(74) *Attorney, Agent, or Firm* — The Roy Gross Law Firm, LLC; Roy D. Gross

(57) ABSTRACT

A method for optimising battery design comprising receiving one or more battery performance targets indicating design constraints on one or more battery performance characteristics, applying one or more trained machine learning models to search and determine one or more optimal battery designs. The machine learning model(s) adapted to replace one or more replace complex computing intensive battery design physical/mechanical models for creating a plurality of battery designs complying with the design constraint(s) and compute their performance scores are trained to learn the physical/mechanical model(s), created using experimental data collected for a plurality of batteries, using a plurality of training samples extracted from simulations of the physical/mechanical model(s).

10 Claims, 11 Drawing Sheets

(56)　　　　　References Cited

FOREIGN PATENT DOCUMENTS

| CN | 113312807 | 8/2021 | | |
|----|-----------|--------|---|---|
| CN | 113935225 | 1/2022 | | |
| JP | 2020-184516 | 11/2020 | | |
| WO | WO-2022242852 A1 * | 11/2022 | .......... | H01M 4/1391 |
| WO | WO-2024077587 A1 * | 4/2024 | .......... | G01R 31/367 |

OTHER PUBLICATIONS

Yamanaka et al., "A Framework for Optimal Safety Li-ion Batteries Design using Physics-Based Models and Machine Learning Approaches" Journal of the Electrochemical Society, 2020 167 100516 (Year: 2020).*

Haghi et al. "Machine Learning in Lithium-Ion Battery Cell Production: A Comprehensive Mapping Study", Chemistry Europe, Battereis & Supercaps, 6(7): e202300046-1-e202300046-14, Published Online Apr. 29, 2023.

Liu et al. "Data Science-Based Full-Lifespan Management of Lithium-Ion Battery Manufacturing, Operation and Reutilization", Springer Book Series, Green Energy and Technology, p. 1-258, 2022.

Lombardo et al. "Artificial Intelligence Applied to Battery Research: Hype or Reality?", Chemical Reviews, 122(12): 10899-10969, Published Online Sep. 16, 2021.

* cited by examiner

100

700

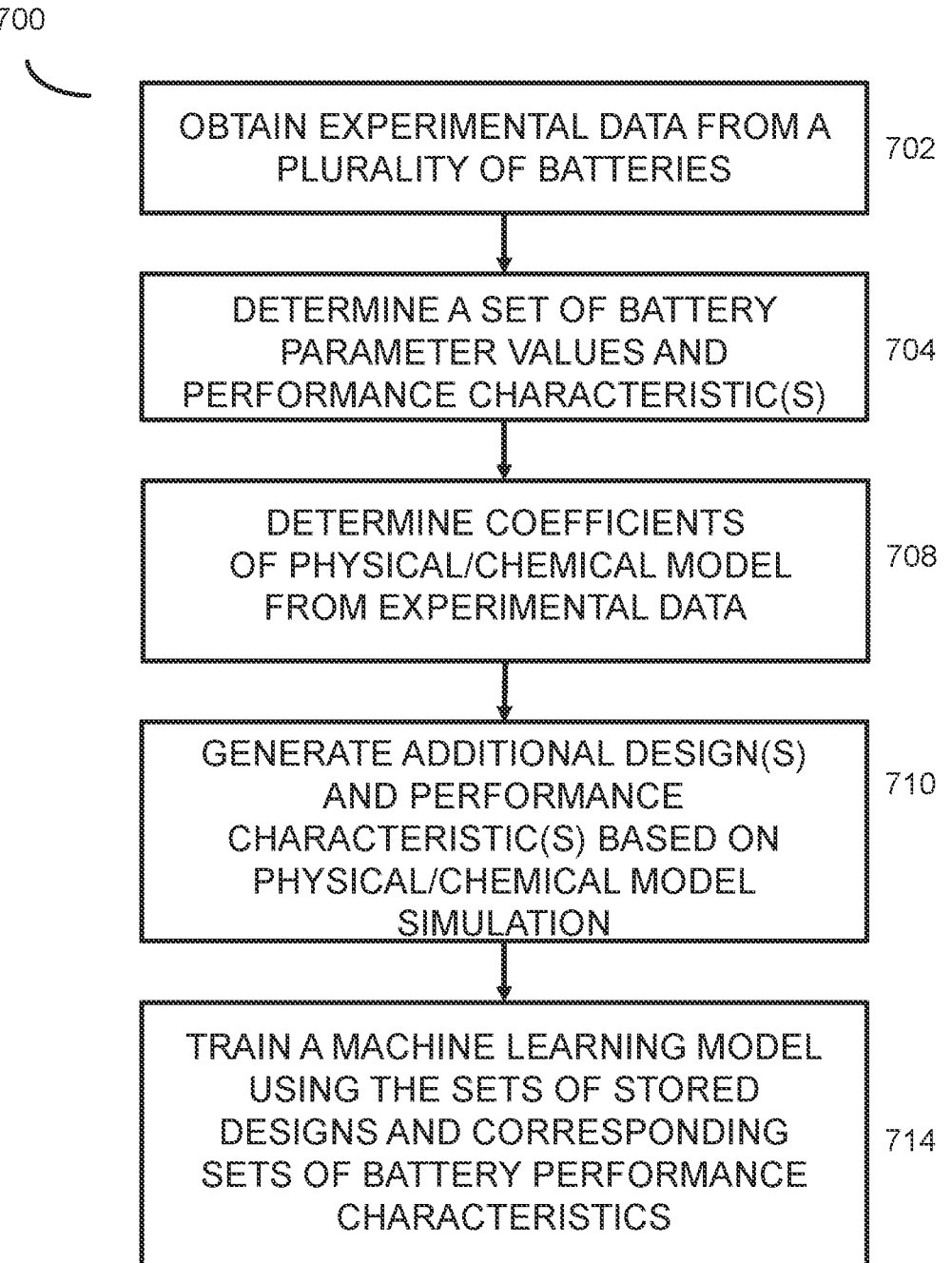

OBTAIN EXPERIMENTAL DATA FROM A
PLURALITY OF BATTERIES          702

DETERMINE A SET OF BATTERY
PARAMETER VALUES AND
PERFORMANCE CHARACTERISTIC(S)          704

DETERMINE COEFFICIENTS
OF PHYSICAL/CHEMICAL MODEL
FROM EXPERIMENTAL DATA          708

GENERATE ADDITIONAL DESIGN(S)
AND PERFORMANCE
CHARACTERISTIC(S) BASED ON
PHYSICAL/CHEMICAL MODEL
SIMULATION          710

TRAIN A MACHINE LEARNING MODEL
USING THE SETS OF STORED
DESIGNS AND CORRESPONDING
SETS OF BATTERY PERFORMANCE
CHARACTERISTICS          714

Figure 7

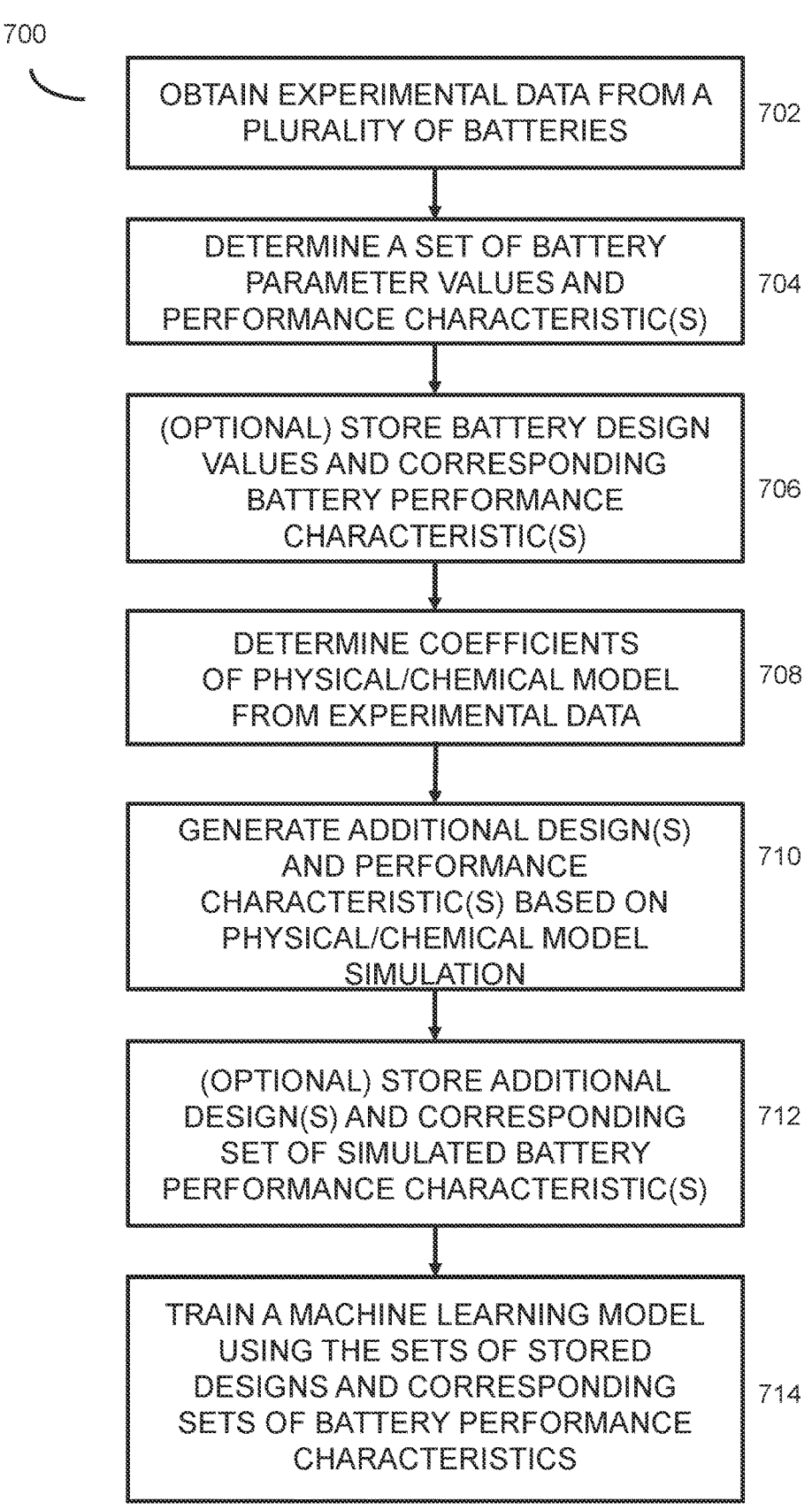

700

OBTAIN EXPERIMENTAL DATA FROM A PLURALITY OF BATTERIES — 702

DETERMINE A SET OF BATTERY PARAMETER VALUES AND PERFORMANCE CHARACTERISTIC(S) — 704

(OPTIONAL) STORE BATTERY DESIGN VALUES AND CORRESPONDING BATTERY PERFORMANCE CHARACTERISTIC(S) — 706

DETERMINE COEFFICIENTS OF PHYSICAL/CHEMICAL MODEL FROM EXPERIMENTAL DATA — 708

GENERATE ADDITIONAL DESIGN(S) AND PERFORMANCE CHARACTERISTIC(S) BASED ON PHYSICAL/CHEMICAL MODEL SIMULATION — 710

(OPTIONAL) STORE ADDITIONAL DESIGN(S) AND CORRESPONDING SET OF SIMULATED BATTERY PERFORMANCE CHARACTERISTIC(S) — 712

TRAIN A MACHINE LEARNING MODEL USING THE SETS OF STORED DESIGNS AND CORRESPONDING SETS OF BATTERY PERFORMANCE CHARACTERISTICS — 714

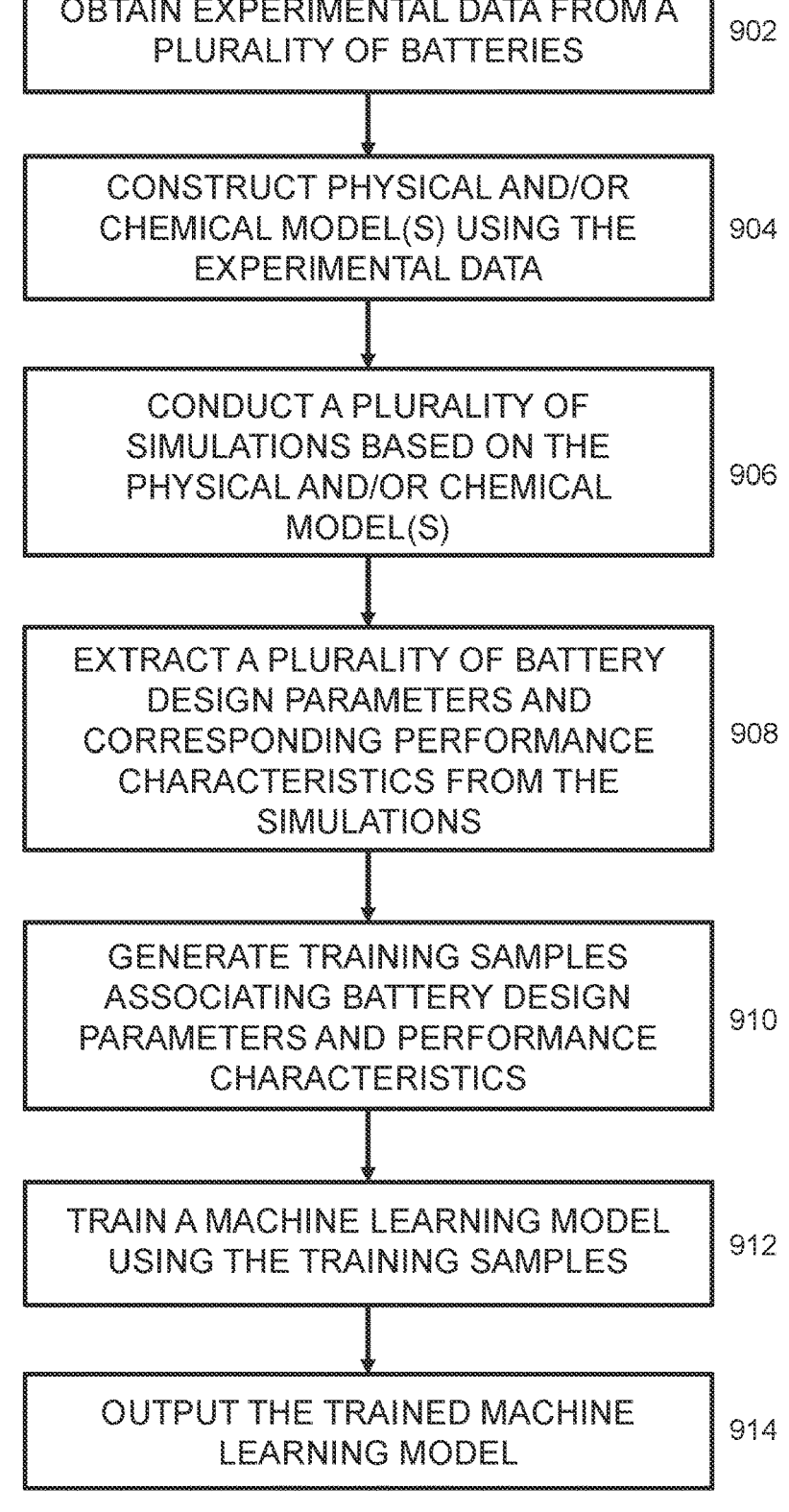

OBTAIN EXPERIMENTAL DATA FROM A PLURALITY OF BATTERIES    902

CONSTRUCT PHYSICAL AND/OR CHEMICAL MODEL(S) USING THE EXPERIMENTAL DATA    904

CONDUCT A PLURALITY OF SIMULATIONS BASED ON THE PHYSICAL AND/OR CHEMICAL MODEL(S)    906

EXTRACT A PLURALITY OF BATTERY DESIGN PARAMETERS AND CORRESPONDING PERFORMANCE CHARACTERISTICS FROM THE SIMULATIONS    908

GENERATE TRAINING SAMPLES ASSOCIATING BATTERY DESIGN PARAMETERS AND PERFORMANCE CHARACTERISTICS    910

TRAIN A MACHINE LEARNING MODEL USING THE TRAINING SAMPLES    912

OUTPUT THE TRAINED MACHINE LEARNING MODEL    914

RECEIVE BATTERY DESIGN CONSTRAINT(S) — 1002

APPLY TRAINED ML MODEL(S) TO COMPUTE PERFORMANCE SCORE FOR A PLURALITY OF BATTERY DESIGNS — 1004

SELECT BATTERY DESIGN(S) HAVING A PERFORMANCE SCORE COMPLIANT WITH THE CONSTRAINT(S) — 1006

OUTPUT THE SELECTED BATTERY DESIGN(S) — 1008

BATTERY DESIGN OPTIMIZATION

BACKGROUND

The present invention relates to systems and methods for optimising battery design using machine learning models.

To meet the growing demand for batteries and to offer more sustainable solutions, batteries with improved performance are required. Battery performance optimization is a multidimensional problem. Current techniques using lab testing and physics based modelling are expensive and time consuming. Previous attempts to achieve this objective to accelerate battery optimization and reduce the cost of R&D have made use of machine learning and artificial intelligence (AI) algorithms but they have been limited to variations in composition of lithium battery materials and, specifically, battery electrode designs that have not been changed for over 30 years. Known techniques are limited in the number of parameters they can optimize, the volume of the database used to train the AI and the physical models used to generate the database e.g. equivalent circuits, single particle models.

Current AI techniques are largely deployed to investigate the optimal content for battery electrodes e.g. adjusting the blending percentage of Lithium Nickel Manganese Cobalt Oxide (NMC) cathode active material and activated carbon conductivity additives to achieve a higher energy/power density. However, the exploration design space is limited and does not significantly improve battery performance. In order to generate data for different design spaces to be used to train the AI, current approaches require many experiments with different values for the various parameters that the experimenters can consider. Additionally, the data is not always of a high quality and in many cases is incomplete. Lack of knowledge about the battery design space is slowing down the development of high-tech industries dependent on batteries.

Additionally, for different battery applications, different specifications and/or criteria may require the selection of different active materials for positive electrodes. For instance, energy anxiety from the electric vehicle industry restricts the deployment of lithium iron phosphate (LFP) because of low energy density. The current research methods cannot fully leverage the potential of the different available materials. As battery manufacture is scaled up, manufacturing techniques can diverge between manufacturers, so in reality there are varying design constraints and priorities at scale. The design space of batteries considered in existing techniques do not fully address the fabricating constraints that come from different manufacturing processes.

Therefore, in order to fulfil the gap in existing battery search and development, this invention provides a method to optimize the microstructure of electrodes (cathode and anode) using advanced machine learning models.

SUMMARY OF THE INVENTION

According to a first aspect of the present invention, there is provided a computer implemented method for optimising battery design, the method comprising: receiving at least one battery performance target wherein the battery performance target indicates a constraint on at least one battery performance characteristic; obtaining a set of battery design parameters and obtaining an upper limit and a lower limit of the values of each battery design parameter; and performing a search to determine an optimal battery design, wherein performing the search comprises: providing a plurality of battery designs to a machine learning model, wherein the model is trained to predict the at least one battery performance characteristic from a battery design, and wherein each battery design comprises a value for each battery design parameter of the set of battery design parameters, and wherein each value is between the upper limit and the lower limit of each associated battery design parameter; receiving the at least one predicted battery performance characteristic from the trained model for each design provided to the model; and determining based on the received plurality of predicted performance characteristics at least one design to be the optimal battery design based on its corresponding battery performance characteristic matching the performance target.

Preferably, the method further comprises receiving a design constraint wherein the design constraint indicates a constraint on a range of values of at least one battery design parameter, and the at least one of the upper and lower limit of the at least one constrained battery design parameter is based on the design constraint.

Preferably, the at least one battery performance target comprises a constraint for a plurality of battery performance characteristics and, optionally, the at least one battery performance target indicates a constraint on a function with a weighting of the plurality of battery performance characteristics.

Preferably the method further comprises: receiving a correlation table based on the trained model wherein the correlation table indicates the correlation between at least two from the set of the battery design parameters and the set of battery performance characteristics.

Preferably, the method further comprises receiving an additional design constraint and adjusting, based on the correlation table, the optimal battery design based on the additional design constraint.

Preferably the method further comprises determining, based on the correlation table, the sensitivity of the optimal battery design to variations in at least one battery design parameter.

According to a second aspect of the present invention, there is provided a computer system comprising a processor and a memory storing instructions executable by the processor to cause the processor to perform the method set out above.

According to a third aspect of the present invention, there is provided a computer readable medium comprising computer readable instructions that, when loaded on and executed by a computer, cause the computer to carry out the method set out above.

According to a fourth aspect of the present invention, there is provided a system for predicting battery performance comprising at least one memory comprising a machine learning model wherein the machine learning model is trained to predict at least one battery performance characteristic from a set of values comprising a value for each battery design parameter of a set of at least one battery design parameter and wherein the set of battery design parameters comprises parameters for microscale battery properties.

Preferably the set of battery design parameters comprises a plurality of battery design parameters and wherein the machine learning model is also trained to infer, based on an incomplete battery design wherein the incomplete battery design is missing at least one value corresponding to a battery design parameter of the set of battery design parameters, the at least one missing value of the battery design parameter and, optionally, a confidence interval for the inferred missing value.

Preferably the machine learning model is also trained to output a confidence interval for the at least one predicted battery performance characteristic.

Preferably the machine learning model is also trained to infer a battery design from one or more images of a battery.

According to a fifth aspect of the present invention, there is provided a method for training a machine learning model, wherein the method comprises: obtaining experimental data measured from each battery of a first plurality of batteries wherein the experimental data comprises data measured based on at least one of the physical and chemical properties of the battery and comprises data characterising battery performance; determining, based on the experimental data, a battery design for each battery and a set of at least one battery performance characteristics for each battery, wherein each battery design comprises a value for each battery design parameter of a set of at least one battery design parameter; determining, based on the experimental data, coefficients of a physical and/or chemical model of the plurality of measured batteries; generating at least one additional battery design and at least one additional set of the at least one battery performance characteristic corresponding to the additional battery design, wherein the at least one additional set of at least one battery performance characteristic is generated based on a simulation of the at least one additional battery design, wherein the simulation is based on the determined physical and/or chemical coefficients; and training a machine learning model by providing the stored battery designs to it as an input and fitting the output to the corresponding sets of the at least one battery performance characteristic such that the model is trained to predict the at least one battery performance characteristic from a battery design.

Preferably, the method comprises storing, in at least one database, the battery design and the corresponding set of the at least one battery performance characteristic for each measured battery of the first plurality of batteries, wherein each battery design comprises a value for each battery design parameter of a set of at least one battery design parameter.

Preferably, the method comprises storing, in the at least one database, the at least one additional design and its corresponding set of the at least one simulated battery performance characteristics.

Preferably the first plurality of batteries comprises a second plurality and a third plurality, and wherein the experimental data comprises a plurality of sets of at least one image scan of each battery of the second plurality of batteries and the third plurality of batteries, wherein determining the battery design for each battery comprises: determining the set of battery design parameter values for each battery of the second plurality of batteries; and selecting the set of image scans of each battery of the second and third pluralities of batteries as the battery design of the corresponding battery; and, prior to training the model by providing the stored battery designs to it, the method further comprises: training the model to infer the battery design of a battery from the images of the battery wherein training the model to infer the battery design from an image comprises providing each set of image scans of each battery of the second plurality of batteries to the model as an input and fitting the output to the determined battery design parameter values of the corresponding battery; and training the machine learning model to predict the at least one battery performance characteristics from a battery design comprises: training the machine learning model by providing the sets of image scans stored as battery designs to it as an input and fitting the output to the corresponding at least one battery performance characteristic.

Preferably, the method further comprises: generating a plurality of incomplete battery designs comprising values for each parameter of a set of battery design parameters except for at least one missing parameter of the set of battery design parameters; training the machine learning model by providing the plurality of incomplete battery designs as an input to the machine learning model and fitting at least one output of the machine learning model to the missing parameter value such that the model is trained to predict at least one missing parameter value from an incomplete battery design, for any arbitrary missing parameter, and wherein the machine learning model is also trained to output a confidence interval for the at least one missing parameter value; determining, based on the experimental data, at least one further incomplete battery designs of a battery of the plurality of batteries and the at least one corresponding battery performance characteristic of the battery; generating at least one inferred complete battery design by providing the at least one further incomplete battery design to the trained machine learning model wherein the at least one inferred complete battery design comprises the at least one incomplete battery design and the corresponding missing parameter value output by the machine learning model; determining, based on the output confidence interval corresponding to the at least one inferred complete battery design, whether the inferred complete battery design is suitable for use as input for training a machine learning model to predict battery performance characteristics; and training the machine learning model to predict the at least one battery performance characteristic from a battery design comprises providing at least one suitable inferred completed battery design to it as an input and fitting the output to the corresponding at least one battery performance characteristic.

Preferably the method further comprises determining the set of battery design parameters based on the correlations between a plurality of design parameters and the at least one battery performance characteristics.

Preferably, simulating the at least one additional battery designs comprises simulating the physical and/or chemical behaviour of particles in the battery at the microscale.

Preferably, the experimental data may comprise data measured from each battery from the first plurality of batteries wherein the first plurality of batteries comprises at least one of a set of batteries with different structures, a set of batteries with different materials and a set of batteries tested under different conditions.

According to a sixth aspect of the present invention, there is provided a computer system comprising a processor and a memory storing instructions executable by the processor to cause the processor to perform the method of the fifth aspect set out above.

According to a seventh aspect of the present invention, there is provided a computer readable medium comprising computer readable instructions that, when loaded on and executed by a computer, cause the computer to carry out the method of the fifth aspect set out above.

According to an eighth aspect of the present invention, there is provided a method of training machine learning (ML) models for predicting performance of battery designs, comprising using one or more processors configured for: constructing one or more battery physical and/or chemical models using experimental data measured for each of a plurality of batteries, extracting a plurality of battery design parameters and corresponding performance characteristics from a plurality of simulations conducted based on the one or more battery physical and/or chemical models, each of the plurality of battery design parameters defines a respective range of values, generating a plurality of training samples each associating one or more of the plurality of battery design parameters with one or more corresponding performance characteristics, training one or more ML models using the plurality of training samples to compute an estimated performance score of a plurality of battery designs each created by defining a respective set of the plurality of battery design parameters each selected from the respective range, and outputting the trained one or more ML models for computing an estimated performance score for one or more battery designs defined by a set of battery design parameters which are within their respective ranges.

Optionally, one or more of the plurality of battery designs comprise a 3D design of battery current collectors.

Optionally, one or more of the plurality of training samples are generated based on the experimental data.

Preferably, the one or more ML models are further trained to create one or more of the plurality of battery designs by selecting a deviating value for one or more battery design parameter of the set of the respective battery design which is outside the respective range defined for the respective battery design parameter.

Preferably, the one or more ML models are further adapted to apply interpolation for computing the performance score of the one or more battery designs defined by a respective set comprising the deviating value for the one or more battery design parameters.

Optionally, one or more of the plurality of battery design parameters are correlated with one or more other battery design parameters.

Preferably, the one or more ML models are further trained to adjust the respective set defining one or more of the plurality of battery designs according to a correlation between at least some of the battery design parameters.

Preferably, the one or more ML models are further trained to estimate a sensitivity of at least some of the plurality of battery designs to a variation in one or more battery design parameters of the respective set.

Preferably, the one or more ML models are further trained to include one or more missing battery design parameters in a respective set of one or more of the plurality of battery designs, the one or more missing battery design parameters are not initially included in the respective set, and select a value for the one or more missing battery design parameters from the respective range defined by the respective missing battery design parameter.

Preferably, the one or more ML models are further trained to compute a certainty score for the one or more missing battery design parameters indicative of a level of uncertainty in the value selected for the respective missing battery design parameter.

Preferably, the one or more ML models are further trained to compute a confidence score for one or more of the plurality of battery designs indicative of a confidence in the estimated performance score computed for the respective battery design.

Preferably, the one or more ML models are further trained to infer one or more battery design parameters of one or more of the plurality of training samples from one or more images of one or more batteries.

Each performance characteristic is expressed in one or more of a plurality of performance metrics of a group consisting of: an overall power capacity, a volumetric power capacity, a gravimetric power capacity, an overall energy capacity, a volumetric energy capacity, a gravimetric energy capacity, a voltage, a current, an internal resistance, a size, a weight, a temperature, a longevity, and/or a cost.

According to a ninth aspect of the present invention, there is provided a system for training machine learning (ML) models for predicting performance of battery designs, comprising one or more processors adapted to execute a code. The code comprising code instructions to construct one or more battery physical and/or chemical models using experimental data measured for each of a plurality of batteries, code instructions to extract a plurality of battery design parameters and corresponding performance characteristics from a plurality of simulations conducted based on the one or more battery physical and/or chemical models, each of the plurality of battery design parameters defines a respective range of values, code instructions to generate a plurality of training samples each associating at least one of the plurality of battery design parameters with one or more corresponding performance characteristics, code instructions to train one or more ML models using the plurality of training samples to compute an estimated performance score of a plurality of battery designs each created by defining a respective set of the plurality of battery design parameters each selected from the respective range, and code instructions to output the trained one or more ML models for computing an estimated performance score for one or more battery designs defined by a set of battery design parameters which are within their respective ranges.

According to a tenth aspect of the present invention, there is provided a method of selecting battery designs using machine learning (ML) models, comprising using one or more processors configured for receiving one or more design constraints for a battery design defining one or more of a plurality of battery design parameters and one or more performance characteristics, each of the plurality of battery design parameters defines a respective range of values, applying one or more trained ML models to compute an estimated performance score for each of a plurality of battery designs, each of the plurality of battery designs is defined by values of a set of battery design parameters selected from a plurality of battery design parameters, the value of each of the plurality of battery design parameters is within the respective range, selecting one or more of the plurality of battery designs having an estimated performance score compliant with the one or more design constraints, and outputting the one or more selected battery design for manufacturing one or more battery according to the one or more selected battery designs.

One or more design constraints defines a plurality of performance characteristics each weighted with a respective weight indicative of its priority.

Preferably, the selection is adjusted according to a correlation between at least one some battery design parameters of the plurality of battery design parameters.

The one or more ML models are trained using a plurality of training samples each associating one or more of the plurality of battery design parameters and with one or more corresponding performance characteristics extracted from a plurality of simulations conducted based on one or more battery physical and/or chemical models constructed using experimental data measured for each of a plurality of batteries.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks automatically. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of methods and/or systems as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the present invention are now described, by way of example only, with reference to the accompanying drawings. With specific reference now to the drawings in detail, it is stressed that the particulars are shown by way of example and for purposes of illustrative discussion of embodiments of the invention. In this regard, the description taken with the drawings makes apparent to those skilled in the art how embodiments of the invention may be practiced.

In the drawings:

FIG. 7 is a flowchart showing steps of a method in accordance with an embodiment of the present invention.

FIG. 8 is a flowchart showing additional steps of the method of FIG. 7 as another embodiment.

FIG. 9 is a flowchart showing steps of an exemplary method of training machine learning models for predicting performance of battery designs in accordance with embodiments of the present invention.

DETAILED DESCRIPTION OF THE INVENTION

Figure 1:
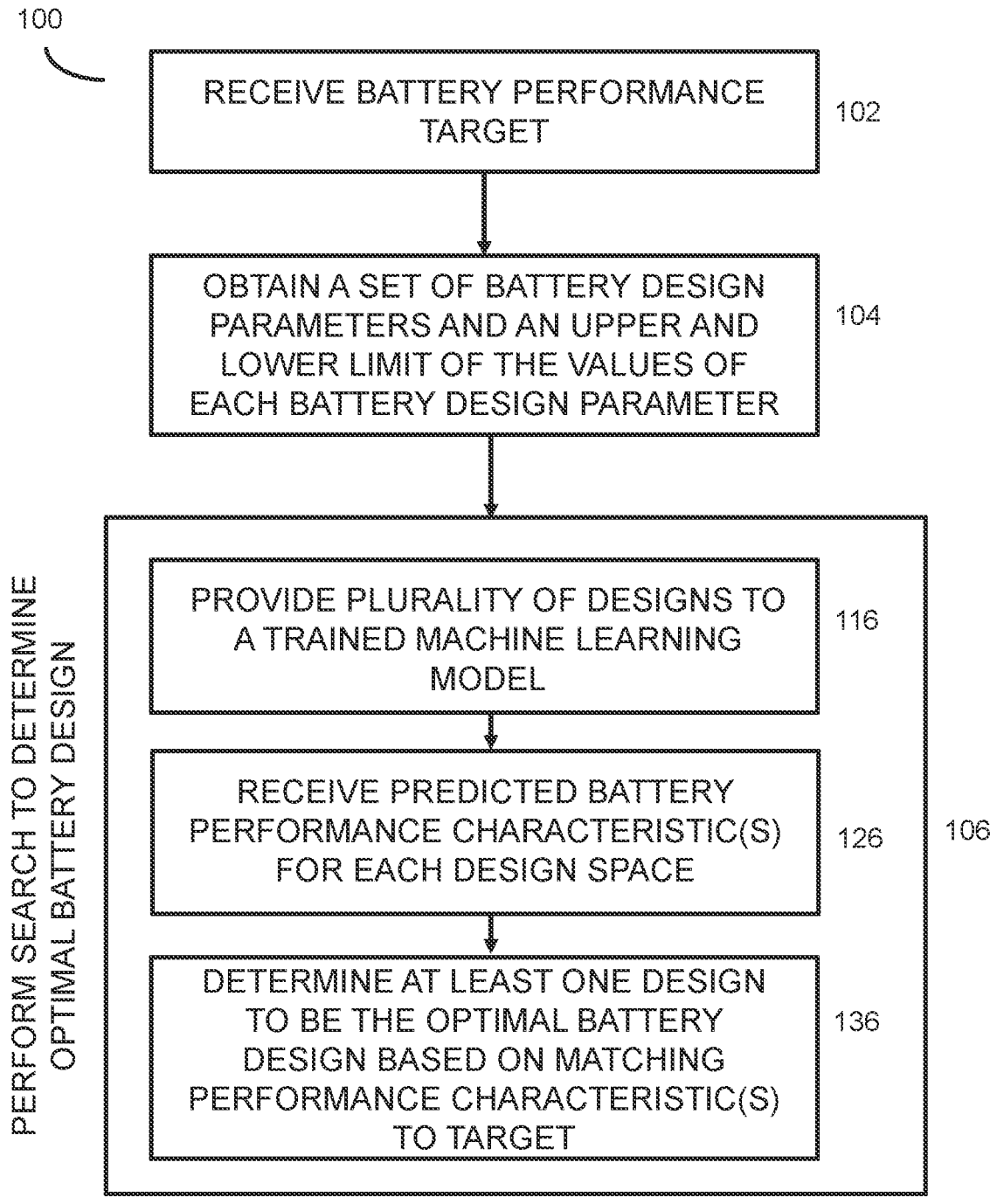
FIG. 1 is a flowchart of an exemplary method of determining optimal battery designs using machine learning, in accordance with an embodiment of the present invention.

The present invention, in some embodiments thereof, relates to optimizing battery design, and, more specifically, but not exclusively, to optimizing battery design using machine learning (ML) models trained to create battery designs according to design constraints and predict performance of these designs.

According to some embodiments of the present invention, there are provided methods, systems and computer program products for training one or more machine learning models to create a plurality of battery designs by setting, selecting, and/or adjusting a plurality of battery design parameters defining each battery designs, and predict performance of each such battery design.

In particular, the ML model(s) may be trained using training datasets created by extracting design parameters and corresponding performance characteristics (attributes) from a plurality of simulations of one or more physical and/or chemical models modelling operation of a plurality of battery (cells). The physical and/or chemical models may be constructed based on experimental data comprising battery design parameters and corresponding performance characteristics measured in a plurality of batteries.

According to some embodiments of the present invention, there are also provided methods, systems and computer program products for using the trained ML models to create a plurality of battery designs according to one or more design constraints, defining one or more battery design parameter, and optimize the designs to comply with performance characteristics also defined by the design constraints.

Extracting battery design parameters and corresponding performance characteristics from the battery physicochemical model(s) may yield an extremely large battery design space which may relate to a huge number of (battery) cell configurations and their corresponding performance characteristics, far beyond what may be extracted from experimental data.

Training the ML model(s) with training dataset(s) created based on the large and diverse battery design space may significantly increase performance of the ML model(s), for example, accuracy, reliability, convergence, and/or the like. Moreover, due to the abundance of battery design parameters correlated with corresponding performance characteristics extracted from simulated battery designs simulated using the physical/chemical modelling, the ML model(s) trained with training data extracted from the simulated battery designs may have greater control of the battery design parameters which may further increase accuracy of predicting performance of battery designs compared to currently existing methods.

Some existing methods for predicting performance of battery designs may rely on simulations using the physical and/or chemical models may be constructed based on experimental data. However, simulating the battery designs using the physical/chemical modelling may be resource intensive and may consume major computing resources, for example, time, processing resources, memory resources, and/or the like.

In contrast, training ML model(s) to predict performance of battery designs based on design data extracted from the physical/chemical models simulation may significantly reduce the computing resources, and/or time required for creating, evaluating and selecting battery designs. This is because the training phase of the ML model(s) including training data extraction from simulations of battery designs using the physical/chemical models, which is resource intensive, may be done offline, relatively infrequently, possibly only once, using high-end system(s) having extensive computing resources.

The trained ML model(s) is significantly more lightweight consuming significantly reduced computing resources and may be thus executed by lower level end computing platforms, systems, and/or devices which may have limited computing resources. As such, creating, evaluating and selecting battery designs optimized to comply with design constraints with high accuracy may be therefore conducted using lower-end and/or low cost computing equipment which is highly accessible and available.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer program code comprising computer readable program instructions embodied on a computer readable medium may be transmitted using any appropriate medium, including but not limited to wireless, wire line, optical fiber cable, RF, etc., or any suitable combination of the foregoing.

The computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

The computer readable program instructions for carrying out operations of the present invention may be written in any combination of one or more programming languages, such as, for example, assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings, FIG. 1 is a flowchart of an exemplary method 100 of determining optimal battery designs using machine learning, in accordance with embodiments of the present invention.

At step 102 of method 100, a battery performance target is received wherein the battery performance target indicates a constraint on at least one battery performance characteristic.

There are various properties of batteries that are desirable, for example energy density because they improve their suitability for use in different applications, and can be used to characterise their performance.

Battery performance may, for example, be characterised by performance characteristics (such as energy or power density) or behaviour under external conditions such as temperature characteristics, e.g., heat flux, or mechanical characteristics such as mechanical strength. A battery performance characteristic may be any one of or a combination of the aforementioned characteristics and also internal resistance (and the variation thereof), cycle life/capacity retention, specific energy and power, temperature increase under different C-rates, cycling voltage changes under different C-rates and more.

The battery performance target can indicate that one or more performance characteristics are to be optimised, for example, energy or power density or cycle life are to be maximised or recharge time is to be minimised. The target may indicate that one or more performance characteristics should be above or below one or more threshold values. For example, the target may be a maximum threshold for internal resistance or a characteristic should stay within a certain range over a range of temperature conditions. The battery performance target allows for the selection of one or more desired battery performance characteristics.

The received battery performance target may comprise a plurality of battery performance targets wherein each of the plurality of battery performance targets is a constraint for at least one battery performance characteristic. For example the target may be to optimise both the energy density and the cycle life. In another example, the battery performance target may also be a constraint on a function with a weighting of a plurality of battery performance characteristics. This allows for a prioritisation of different targets selected by a user where adapting the design parameters to move a first battery performance characteristic towards a first battery performance target moves one or more second battery performance characteristics away from one or more second battery performance targets. For example, it may not be possible to optimise both energy density and power density so the battery performance target may be to optimise a function with a weighting for both the energy density performance characteristic and the power density performance characteristic.

A design space is the specific configuration of design parameters used to build a design. A battery design space may be defined by the set of battery design parameters (e.g. a selection of electrode thickness, porosity etc.) and the associated upper limit and lower limit of each battery design parameter of the set. A battery design space can be viewed as a non-orthogonal vector space in which the battery design parameters correspond to vectors, which may be non-orthogonal vectors, that form a complete basis of the space and the space is bound along each vector by the upper limit and the lower limit of the values of the corresponding battery design parameter.

Figure 2:
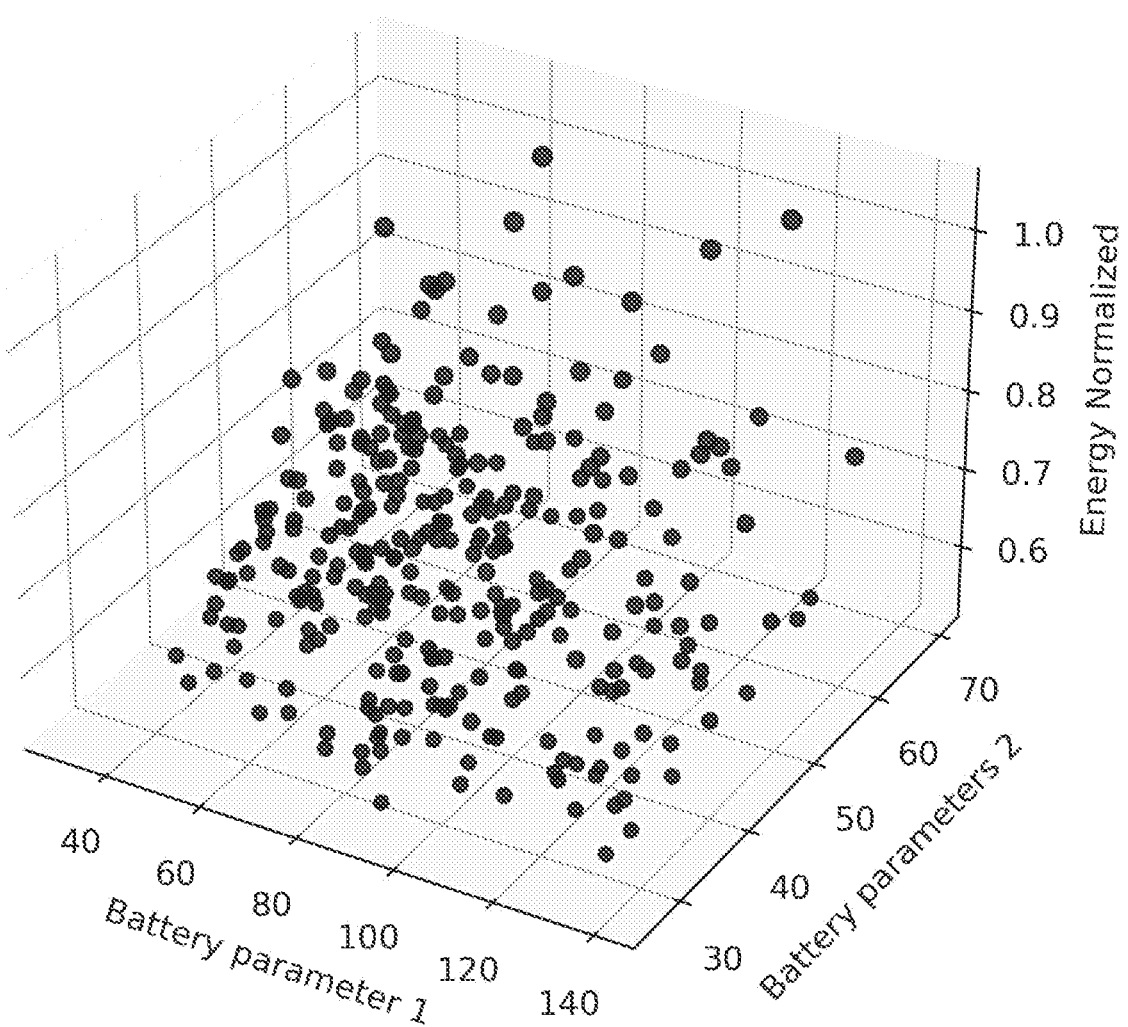
FIG. 2 shows a representation of battery designs in an example battery design space.

FIG. 2 shows a representation of battery designs in an example battery design space. The space in FIG. 2 is defined by two battery parameters and is characterised by the normalized battery energy. Each dot corresponds to a battery design with a certain battery energy given the two values of the battery parameters. If the highest possible battery energy is to be targeted, the highest dots may be considered an optimal battery design. A plurality of dots at the same height or within the range about a height defined by the variance in properties that will be caused by sensitivity to manufacturing tolerances may define a subspace which may be considered and then further factors are used to select a specific pair of values for the battery parameters. A battery design may be characterised by a large number of physical and chemical parameters. When accounting for possible microscale differences between different battery designs, and taking into account all possible manufacturing options, the number of parameters may number in the hundreds or more. A battery design space is defined by a set of one or more battery design parameters and an upper limit and a lower limit of the values of each battery design parameter. A battery design corresponds to a point or region in the design space, and a region may allow for a variance in the design parameters. In theory, there may be a global design space for all possible manufacturable battery designs. In practice, for a given manufacturer, only a subset of the possible battery design parameters will be adjustable based on the choice of manufacturing method and battery type. It is preferable to be able to define a specific battery design space which may be a subcategory of the global design space. Then an optimal battery design may be found within that specific battery design space.

Method 100 comprises a step 104 of obtaining a set of battery design parameters and obtaining an upper limit and a lower limit of the values of each battery design parameter. The set of battery design parameters indicates the particular combination of design parameters that form the specific battery design space to be searched for an optimal battery design. The value of the battery design parameter can be varied between its associated upper and lower limit during optimisation.

The set of battery design parameters of a battery design space may include physical characteristics of the battery including the physical characteristics of the anode and cathode; it may also include the chemical properties of the battery and battery materials. For example, the battery design parameters may comprise at least one of electrolyte volume fraction, active material volume fraction, binder volume fraction, electrode thickness, particle size distribution and particle shape distribution. In some examples, the battery design is a 3D battery design for battery electrodes.

Figure 3A:
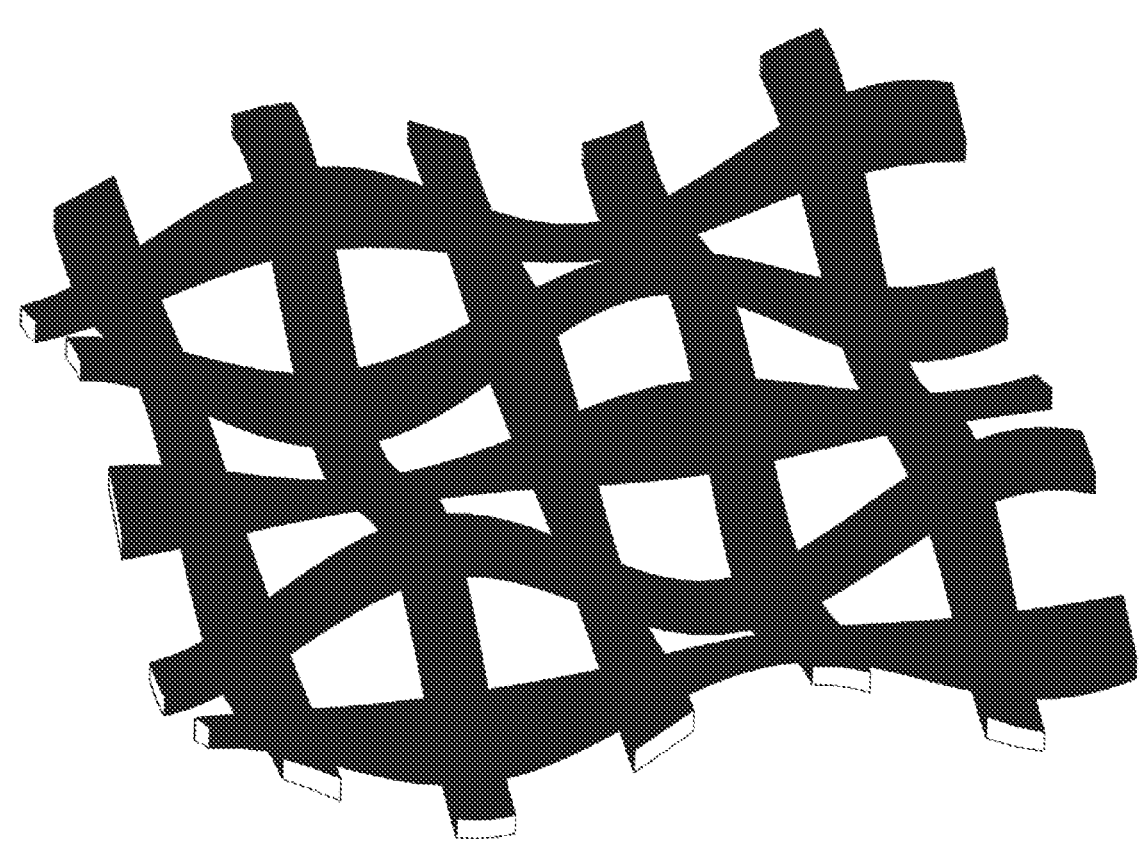
FIGS. 3A to 3C show diagrams of various views of a 3D design for battery electrodes.
Figure 3B:
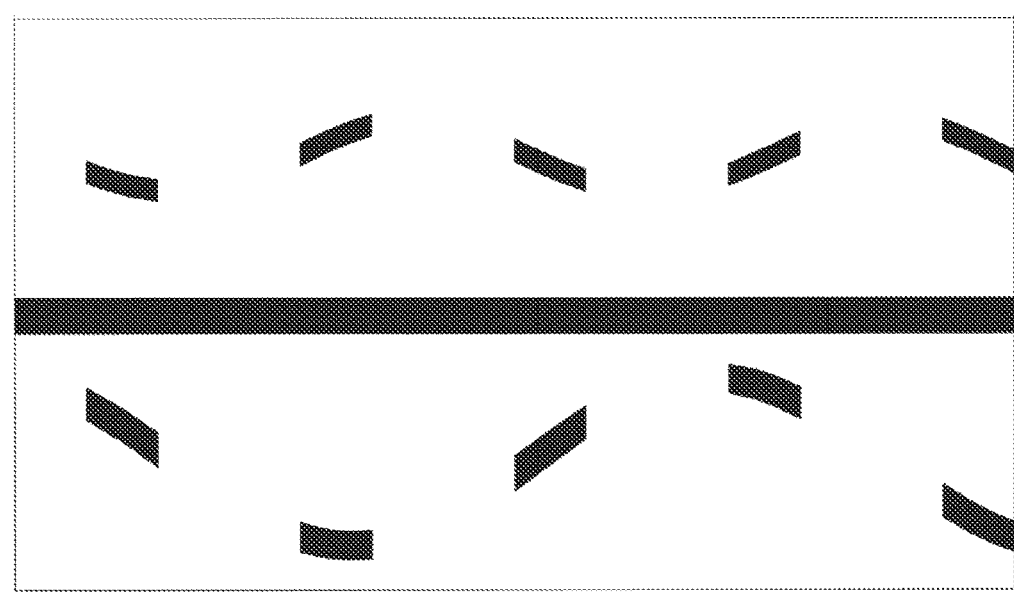
Figure 3C:
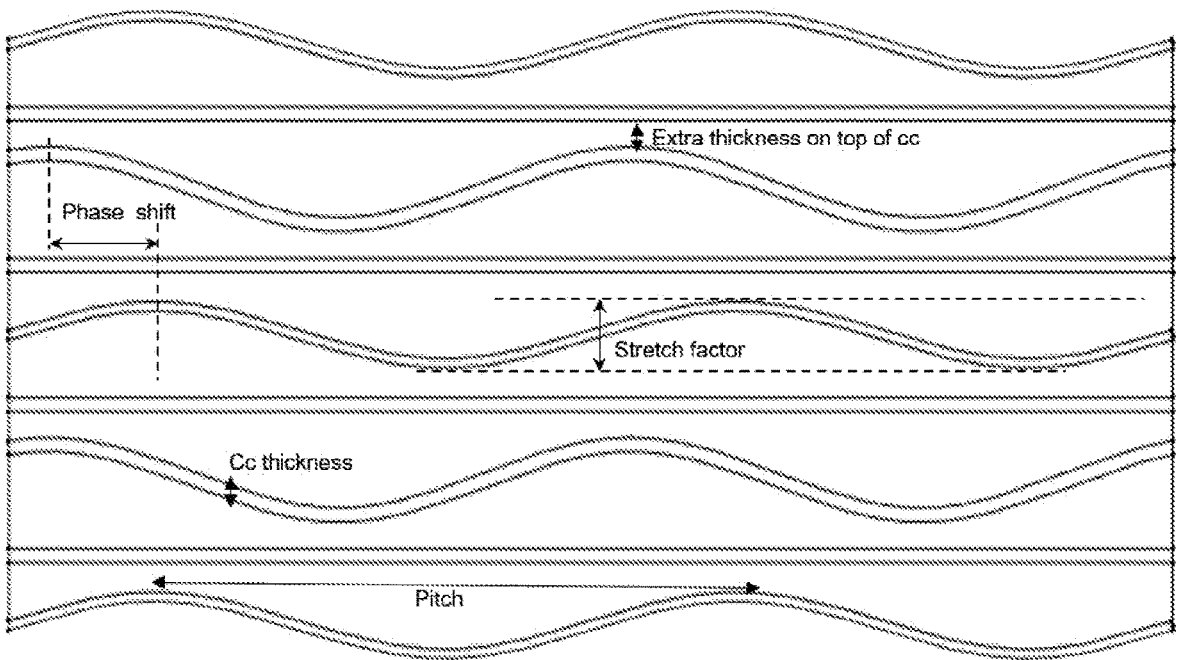

FIGS. 3A to 3C show schematic diagrams of various cross-sections of an example 3D design for battery electrodes. FIG. 3A shows an isometric perspective of an example of a 3D current collector structure. FIGS. 3B and 3C show diagrams of a cross-section view of the 3D current collector structure from two orthogonal planes. Variation occurs in the structure of the 3D current collector in each dimension. For example the collector may be formed of bands of conductive material as shown in FIGS. 3A to 3C wherein some of the bands extend parallel to each other along one axis and then other bands extend parallel to each other along an orthogonal axis such that the bands form a grid. Each band may form a sinusoidal like shape that fluctuates over a third axis. The sinusoidal shape may vary between each band.

The battery design may comprise 3D designs for anode and cathode current collectors as demonstrated in FIGS. 3A to 3C. For example, the battery design parameters may comprise at least one of the thickness of an anode or cathode current collector, a spatial frequency of variations in the shape of the current collector, a phase shift between different variations of different current collectors in the battery, and amplitude of variations in the shape of the current collector. The battery design parameters may also comprise at least one of electrolyte volume fraction, active material volume fraction, binder volume fraction, material porosities, particle size distribution and particle shape distribution. The current collector structure may be an Addionics Current Collector structure as described in PCT application number PCT/IL2020/050581.

Obtaining the set of battery design parameters and the set of associated upper and lower limits may comprising obtaining each set separately. Obtaining each set may be done by receiving the set from an external provider or by determining the step directly or through a combination of both as part of the step 104. The set of battery design parameters may be determined based on the battery design parameters that a machine learning model, which is to be used as part of step 116 of the method, is trained to receive as an input. For example, the set of battery design parameters should only include design parameters that the machine learning model is trained to receive as an input so the set of battery design parameters may be selected to match the set of battery design parameters the machine learning model may use as an input. The training of the machine learning model may be performed using user selection of the battery design parameters and/or generating the battery design parameters based on experimental data, as described in connection to the method of FIG. 7. The input set for the machine leaning model may be determined directly from the model or it may be determined from the training data and/or experimental data used to train the machine learning model or received from a source that has previously determined the input set. In some examples, the set of possible input battery design parameters for the machine learning model may be obtained and then an input is received from a user wherein the input indicates a subset of the input set to be used as the set of battery design parameters for the method 100. Any parameters that are not to be part of the set of battery design parameters but which the model is trained to predict the performance characteristic from may be set to a constant value. These constant values may specified by the user. Alternatively, they may be determined based on the training data used to train the model. For example, the values may be an average based on the training data.

Additionally or alternatively, experimental data may be used to identify the degree of correlation between battery design parameters with a battery performance characteristic to be targeted and then the set of battery design parameters are determined based on the degree of correlation. By measuring data from a plurality of batteries of a particular type or for use in a particular type of industrial application, the set of battery design parameters may be different for, and thus be optimally selected for, the different types and/or industrial applications of batteries. Similarly, the upper and lower limits of the values of the parameters may be generated based on experimental data for different types and/or industrial application of batteries. For example, the upper and lower limits of the values may be based on the measured variation in a battery design parameter that is found in a class of batteries, such as batteries made under a particular manufacturing method, or that are found in batteries subjected to or manufactured under different conditions.

The upper and lower limits of the battery design parameters may also be obtained based on the machine learning model. The machine learning model is trained based on data comprising values for the battery design parameters which will therefore a highest and lowest values used for each parameter when training the model. These highest and lowest values may be used as the upper limit and lower limit of the battery design values when performing optimisation of the battery design. The values of the upper and lower limits may be determined or received from a source that has determined the values from the model directly. Alternatively, each upper limit and each lower limit of each battery design parameter may be determined from experimental data or from the training data used to train the machine learning model. For example, the upper and lower limits may be set to be equal to the highest and lowest value that may part of the training data set. While the machine learning model may be used to interpolate the performance of designs with design parameter values outside of the range of values used to train it, the predictions made from values within the range will have higher confidence than those made from values outside of the range. One or more of the limits may also be set based on information derived from experimental data or from publically available databases that describe the range of possible or common values of battery design parameters. The limits may depend on the type of battery being modelled. The upper and lower limits may be pre-determined based on the experimental data or training data and then stored in a memory. If an upper and/or lower limit for a battery parameter value is not received, the method may include loading the pre-determined values from a memory. The values on the memory may be updated to reflect new experimental data or to reflect changes in the knowledge of the skilled user.

Figures 4, 5:
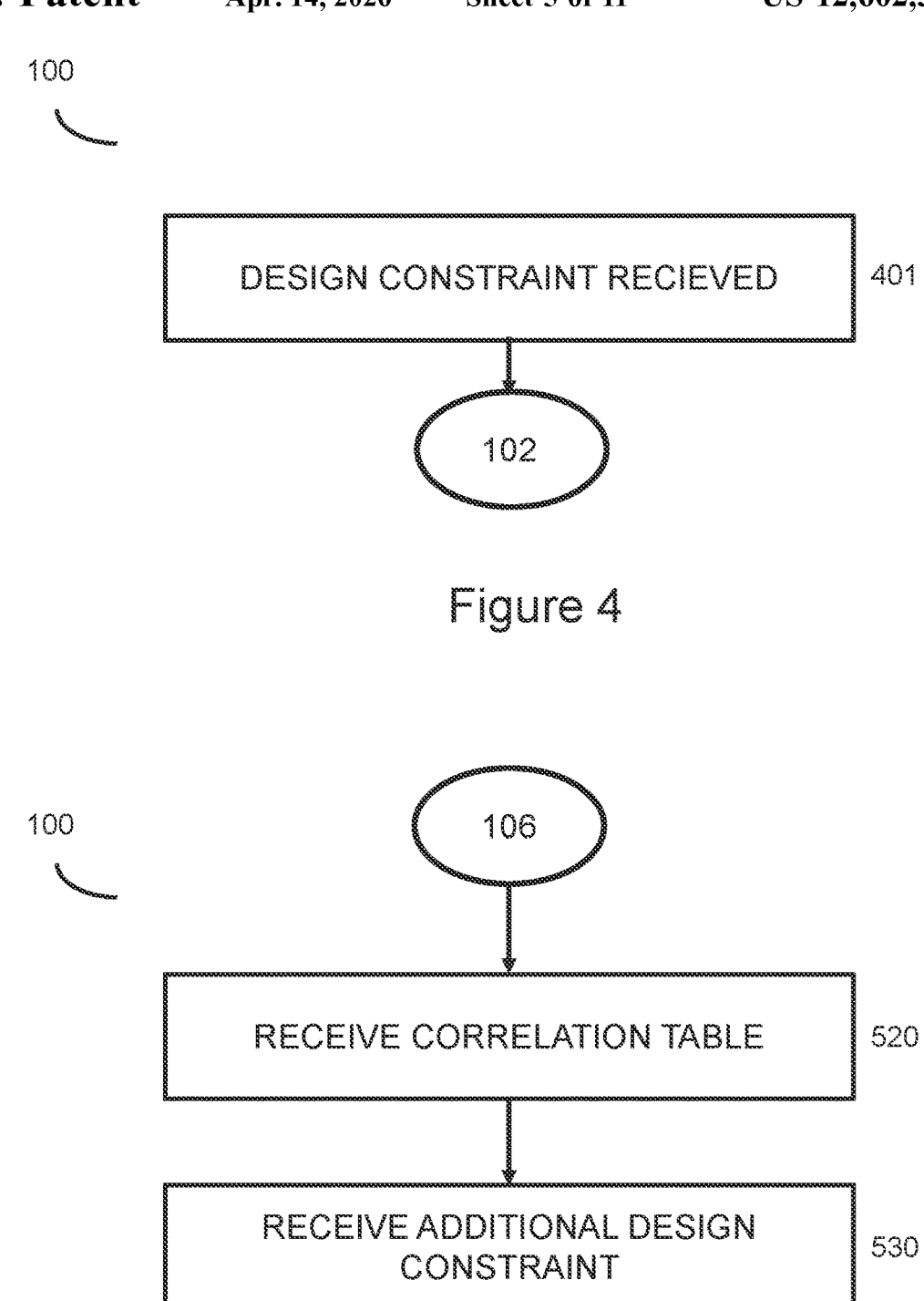
FIG. 4 and FIG. 5 are flow diagram showing of exemplary optional steps of the method of FIG. 1.

FIG. 4 is a flowchart showing optional steps of the method 100 of FIG. 1. Method 100 may, optionally, further comprise the step 401 of receiving a design constraint wherein the design constraint indicates a constraint on the range of values of at least one battery design parameter. The design constraint may be based on a limitation on the manufacturing process for the battery design. For example, the thickness of the electrodes may be limited to be within a range e.g. 50-150 μm. The constraint may also refer to a level of precision in the manufacturing process, e.g. the level of precision of porosity being less than 0.5%, so then the design constraint limits the degree of precision in the design parameter. As shown in FIG. 4, step 401 may be performed before the other steps of method 100. Alternatively, step 401 may be performed at any point of method 100. Preferably, step 401 is performed at any point before step 104 so that the at least one of the upper and lower limit of the constrained battery design parameter may be based on the received design constraint. For example, the battery design space may only include designs where the electrodes have a thickness within 50-150 μm. The design constraint may, additionally or alternatively, be received after step 104 and before step 106 and the step 106 of performing a search to find may be limited based on the received design constraint. For example, the search method may be limited to a subrange of the design space received; as another example, the level of precision of the search may be set by the received design constraint. In other examples where the design constraint is received later in the method, the results of previous steps may be filtered to remove results that do not correspond to the received design constraint.

At step 106, a search is performed to determine an optimal battery design. The searching step 106 itself comprises step 116 wherein a plurality of battery designs are provided to a machine learning model wherein the model is trained to predict the at least one battery performance characteristic from a battery design. Each battery design comprises a value for each battery design parameter of the set of battery design parameters and each value is between the upper limit and the lower limit of each associated battery design parameter. Further features of the trained model and the input and output of the model may be understood in combination with the description of the system in FIG. 6. The training of model may be performed by methods and systems described in relation to FIG. 7.

Step 106 also comprises a step 126 of receiving the at least one predicted battery performance characteristic from the trained model for each battery design provided to the model. Step 106 also comprises a step 136 of determining based on the received plurality of predicted performance characteristics at least one battery design to be the optimal battery design based on its corresponding battery performance characteristic matching the performance target. The battery design that is determined to be optimal may then be output for use in manufacturing a battery according to that design using techniques for battery manufacture known in the art.

The search space will correspond to the battery design space defined by the set of battery design parameters and the associated upper limit and lower limit of each value of each battery design parameter. The search to find the optimal battery design within the battery design space may be performed using techniques as known in the art for function optimisation wherein the objective function is or is based on the trained model. For example, known techniques for maximising a function may be used for finding a design within the design space which has the maximum value predicted by the trained machine learning model for the battery performance characteristic. The search may iteratively provide a battery design to the machine learning model until the design with the battery performance characteristic that matches the battery performance target is identified. The optimal design and the corresponding battery performance characteristics may be provided as an output. For example, the optimiser may receive a battery performance target that indicates that a particular battery performance characteristic, e.g. energy density, should be maximised. A stopping criteria for the search, such as a degree of precision, may be received as part of the battery performance target, determined based on a received design constraint or may be automatically applied by the optimisation method. The trained model can be provided individual battery designs as part of individual steps of a function maximum search wherein at each step it outputs the battery performance characteristic, such as energy density and then a calculation is performed on the plurality of output performance characteristics to determine to determine if the current output is within the accuracy threshold around the maximum.

A plurality of battery designs may be determined to be an optimal design based on their corresponding battery performance characteristics matching the performance target. Multiple searches over the battery design space may be performed to find a plurality of candidates for the optimal battery design. Each time a search is run a candidate optimal battery design is found. Each candidate can be characterised by the values of the battery design parameters and the predicted battery performance. As in principle, a search algorithm may only approach and not arrive exactly at a global optimum, each candidate will be at least a little different. Furthermore, the prediction for the battery performance candidates is not a 100% probability. Different predicted performance characteristics may be output and they may be output with different degrees of confidence. In some examples, the trained machine learning model may output the confidence interval for the at least one inferred battery performance characteristic. Therefore, different candidates are able to be distinguished by the differences in battery design parameter values and predicted battery performance characteristics and, optionally, the confidence intervals. In some examples, the battery designs are very close but in other examples, the battery designs may be very different but give similar predicted battery performance characteristics. For one example, multiple searches may provide one candidate design with high cathode thickness but low porosity and another candidate design with low cathode thickness and high porosity which each give the best predicted battery performance. Each candidate optimal battery design can be provided as an output so that a user can select one according to their actual physical constraints such as manufacturing capability, cost, material constraints or machine precision.

FIG. 5 is a flowchart showing additional optional steps of the method 100 of FIG. 1. Method 100 may further comprise step 520 in which a correlation table is received based on the trained model. The correlation table may be an output of the process for training the machine learning model, as described below in relation to the system and methods of FIG. 7. A correlation table indicates the relationship between the battery design parameters and the battery performance characteristics. The correlation table comprises information that indicates the interactions between the input parameters and the output performance constraint. The information in the correlation table may be used to determine the negative or positive impacts that changing an input parameter may have on an output parameter; the information may also show the correlation between different input parameters. For example, the individual contribution of electrode thickness, current collector thickness, particle size, electrode and current collector porosity, 3D current collector microstructure etc. on the specific power may be determined. The correlation table may also be used to determine the sensitivity of the optimal battery design to variations in at least one battery design parameter. The sensitivity analysis may be used to determine the variation in the performance characteristics based on the manufacturing tolerances of the design parameters. The correlation table is used to determine the impact of a change in a battery design parameter on the battery performance characteristic, for example, if the manufacturing tolerance for the electrode thickness only allows the electrode thickness to be guaranteed to be within a range of +1 μm, the sensitivity analysis is able to calculate the change in specific power if the electrode thickness is changed by 1 μm. The sensitivity of a design may be used when selecting an optimal battery design from a plurality of candidate battery designs to indicate which candidate design is the most appropriate for real conditions. For example, one candidate design requires a low electrode thickness which the specific power is more sensitive to for a ±1 μm level of manufacturing precision, while the other candidate has a high electrode thickness which allows for the specific power to be less relatively affected by a ±1 μm variation. The correlation table may be used to determine an additional constraint on the battery design. For example, if one or more design parameters are found to have low correlation or are independent of the targeted battery performance characteristic, these design parameters may be set to a constant value during optimization or an indication may be given to prompt a user to set a constraint on the values for this parameter for performing the optimisation.

Method 100 may also further comprise step 530 in which an additional design constraint is received. Preferably, though optionally, this occurs after receiving the correlation table. The additional design constraint may be a function of a plurality of design parameters. For example, the total amount of resources or cost used in a battery design or the weight of the battery design may be a function of a plurality of design parameters such as those which determine the amount of material used in the design.

The additional design constraint may be a soft constraint i.e. a constraint on the design that does not strictly limit the design space. For example, it may be preferable for certain physical components of the battery design to be smaller and so the additional design constraint indicates that the size should be maximised. The soft constraint may apply to a function of a plurality of design parameters.

In step 540, the optimal battery design is adjusted based on the correlation table and based on the additional design constraint. The function of the additional design constrain is used to determine which design parameters should be adjusted to fit the additional design constraint. The impact of the change in design parameter on the performance characteristic can be determined from the correlation table. The correlation table may then be used to fine-tune the design variables which contribute significantly to the target performance and which interact with other variables. The design parameters may be adjusted to fit the additional design constraint better while staying within a threshold of the optimal battery design by calculating the size of an impact of the battery performance characteristic for a given improvement in the additional design constraint.

Figure 6:
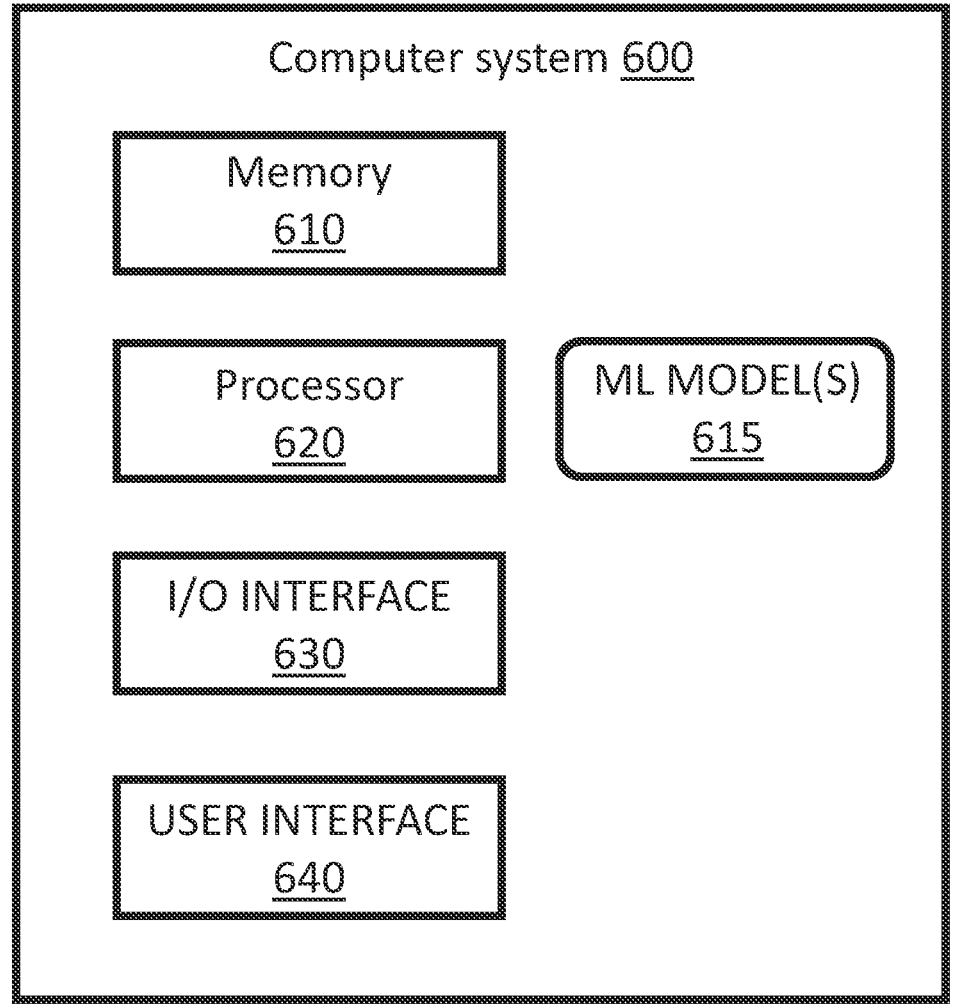
FIG. 6 is a block diagram of an exemplary system for predicting battery performance suitable for carrying out embodiments of the present invention.

FIG. 6 is a schematic diagram of a system for predicting battery performance suitable for carrying out embodiments of the present invention.

The machine learning model 615 may have been trained by methods and techniques such as the processes 700 and/or 900 described in relation to FIG. 7 and FIG. 9 respectively. System 600 may comprise at least one processor or may be communicatively coupled to a processor of an external system, such as the processor of system 900 in FIG. 9, for use in the method 100 of FIG. 1 and/or the method 1000 of FIG. 10.

An exemplary system 600, for example, a computer, a server, a computing node, a mobile device, and/or the like may perform one or more of the methods described herein that correspond to embodiments of the present invention, for example, predicting battery performance and selecting battery designs suitable for carrying out embodiments of the present invention.

System 600 may comprises a processor 620, a memory 610, an Input/Output (I/O) interface 630 and optionally a user interface 640.

The processor(s) 620, homogenous or heterogeneous, may include one or more processing nodes arranged for parallel processing, as clusters and/or as one or more multi core processor(s). The memory 610 may include one or more non-transitory memory devices, either persistent non-volatile devices, for example, a ROM, a Flash array, a hard drive, an SSD, and/or the like as well as one or more volatile devices, for example, a RAM device, a cache memory and/or the like. The memory 610 may further include one or more storage systems, for example, a database, a file system, and/or the like. Optionally, the memory 610 may include one or more remote storage resources accessible via the I/O interface 1130, for example, a Network Attached Storage (NAS), a storage server, a remote database, a cloud storage service, and/or the like.

The processor(s) 620 may execute one or more software modules, for example, a process, a script, an application, an agent, a utility, a tool, an Operating System (OS), a service, a plug-in, an add-on and/or the like each comprising a plurality of program instructions stored in a non-transitory medium (program store) such as the memory 610 and executed by one or more processors such as the processor(s) 620.

Optionally, the processor(s) 620 may include, utilize and/or apply one or more hardware elements available in a formworks positioning system, for example, a component, an Integrated Circuit (IC), an Application Specific IC (ASIC), a Field Programmable Gate Array (FPGA), a Digital Signals Processor (DSP), a Graphic Processing Unit (GPU), an Artificial Intelligence (AI) accelerator, and/or the like.

The processor(s) 620 may therefore execute one or more functional modules utilized by one or more software modules, one or more of the hardware modules and/or a combination thereof. For example, the processor(s) 620 may execute one or more functional modules for executing one or more of the processes 100, and/or 1000. In another example, the processor(s) 620 may execute an ML model 615 which may be stored in the memory 610.

The ML model 615 may comprise one or more models as known in the art, for example, a neural network, such as for example, a convolutional Neural Network (CNN), a Recurrent Neural Networks (RNN), a Deep Neural Networks (DNN), and/or the like, a classifier, a Support Vector Machine (SVM) and/or the like.

It should be noted, that while in practice the processor(s) 620 may execute the one or more functional modules, for brevity the system 600 is described to execute these processes.

The I/O interface 630 may include one or more wired and/or wireless I/O interfaces, ports and/or interconnections, for example, a Universal Serial Bus (USB) port, a Bluetooth (BT) interface, a Radio Frequency (RF) interface, and/or the like. In another example, the I/O interface 630 may include one or more wired and/or wireless network interfaces for connecting to one or more wired and/or wireless networks, for example, a Local Area Network (LAN), a WLAN (e.g. Wi-Fi), a Wide Area Network (WAN), a Metropolitan Area Network (MAN), a cellular network, the internet and/or the like.

Via the I/O interface 630, the system 600 may communicate with one or more external devices. For example, via the I/O interface 1130, the system 1100 may receive one or more ML models 615 trained to predict performance of battery designs, in another example, the system 600 may receive via the I/O interface 630 one or more design constraints for creating, evaluating and selecting one or more battery designs. In another example, via the I/O interface 630, the system 600 may output one or more battery designs created, evaluated and selected based on their predicted performance, in particular with respect to the received design constraints.

The user interface 640 may comprise one or more Human-Machine Interface (HMI), for example, a display, a touchscreen, a keyboard, a pointing device (e.g., mouse, touchpad, etc.), an audio interface (e.g., speaker, microphone, etc.), and/or the like for interacting with one or more users.

Via the user interface 640, the system 600 may communicate with one or more users, for example, to receive one or more design constraints. The system 600 may further execute one or more Graphic User Interfaces (GUI) to establish a user friendly, efficient and/or effective user interface with the user(s).

Battery design parameters may be parameters of the microstructure of the battery design features, in particular a battery design parameter may be a parameter of the microstructure of the electrodes. Microscale features may have dimensions of an order of magnitude from 0.1 to 1000 μm. For example, the thickness of electrodes may be in the range 1 to 1000 μm and/or the particle sizes may be between 0.01 μm to 100 μm. The battery design parameters may further comprise features with dimensions larger than this, or example the spacing between cathodes or between anodes may be of the order of 1 mm or higher.

In some examples where the set of battery design parameters comprises a plurality of battery design parameters, the machine learning model may be trained to infer, based on an incomplete battery design wherein the incomplete battery design is missing at least one value corresponding to a battery design parameter of the set of battery design parameters, the at least one missing value of a battery design parameter in the set of design parameters. Information about a battery design parameter may be missing from the design provided to the trained model. For example, the machine learning model may be provided an incomplete battery design and may output a complete battery design it has inferred from the incomplete battery design wherein the inferred complete battery design comprises the values of the battery design parameters from the incomplete battery design and an inferred value for the missing battery parameter. The machine learning model may also output a confidence interval of the inferred value in order to indicate the level of uncertainty in the inferred value. The missing information may not have been captured by experimental data used to build the initial design or the data may have provided a low level of confidence in the measured parameter or otherwise have been a poor quality measure of the design parameter. For example, when the design is based on an image scan, the image may not have been of sufficient quality or resolution to capture certain details. In particular, structural details such as material porosity before and after the calendering process (compression of the electrodes to adjust porosity), particle size distribution, and different fractions of active materials, binders, pores, etc. in the battery material are very difficult to measure and likely to be missing. In some examples, the machine learning model may also be trained to infer a battery design from one or more images of a battery.

The trained model may be provided one or more images, wherein the image is acquired by scanning a battery, and may output values for each parameter of a set of battery design parameters for the battery.

FIG. 7 is a flow diagram for a method for training a machine learning model in accordance with embodiments of the present invention. The method 700 of FIG. 7 may be used for training the machine learning model 615 of FIG. 6 or other models suitable for use in method 100 of FIG. 1. Method 700 comprises a step 702 of obtaining experimental data measured from each battery of a first plurality of batteries wherein the experimental data comprises data measured based on at least one of the physical and chemical properties of the battery and further comprises data characterising battery performance. In particular, the experimental data measured for the plurality of batteries may comprise one or more physical and chemical properties of each battery and one or more corresponding performance characteristics which may thus define relations between the physical and chemical properties and the performance characteristics.

The experimental data may be received from an external source or may be generated from experimental apparatus where the method is performed. The experimental data may be in a variety of forms, for example, the experimental data may be quantitative measurement values, such as time-series, categorical variables, continuous variables or a combination of any thereof, or may be 2D or 3D images such as image scans from secondary electron microscopy, x-ray tomography, or other approaches known in the art, of the battery design structure.

A variety of different types of batteries and different conditions under which the batteries are tested may be used to make up the measured plurality of batteries in order for the experimental data to include information based on parameters which vary in different types of batteries and under different conditions. The experimental data may comprise data measured from each battery from the plurality of batteries wherein the first plurality of batteries comprises at least one of a set of batteries with different structures, a set of batteries with different materials and a set of batteries tested under different conditions. The set of batteries tested under different conditions may comprise the same battery being placed under different conditions i.e. one battery in the set may be of the same construction as another battery in the set or is the same battery but under a different condition. The different conditions may be any of using different C-rates, different temperatures, different environments, different humidity, different pressures, different cell qualities (fresh, old, aged etc.).

The structures of the different batteries may vary based on the different physical dimensions of the physical properties of the battery, for example, the parameters of the physical structure of the battery as shown in FIG. 2 may be varied across a plurality of batteries to provide experimental data for a sampling of values across the range of possible sizes and values of those parameters. The battery materials of the measured batteries may vary based on their chemical composition; they may also vary based on the quality of the materials used; the battery cells may have been aged, either from use (e.g. the number of charge/discharge cycles) or merely from being on a shelf for some time or both. Therefore the first plurality of batteries may comprise a set of batteries with different materials. Additionally, the batteries may be tested under different conditions. For example, the current loads may be varied; they may be tested under different temperatures; generally, the experimental data can be acquired from batteries that are measured over a range of values of a testing parameter.

The experimental data may be measured from physical and chemical properties of the battery that appear at the microscale. Battery physical and chemical properties that may be measured may include but not limited to: porosity before and after calendering (compression of the electrodes to adjust porosity); particle size distribution before and after calendering; volume faction and volume specific surface area of each phase (electrode material, current collector, pores, etc.); and/or lithium-ion diffusivity in various phases.

For each battery of the plurality of batteries that are measured, experimental data about the battery performance is also measured. As described in relation to FIG. 1, battery performance may, for example, be characterised by performance characteristics (such as energy or power density) or behaviour under external conditions such as temperature characteristics, e.g. heat flux, or mechanical characteristics such as mechanical strength. A battery performance characteristic may be any one of or a combination of the aforementioned characteristics and also internal resistance (and the variation thereof), cycle life/capacity retention, specific energy and power, temperature increase under different C-rates, cycling voltage changes under different C-rates and more.

Method 700 further comprises a step 704 of determining, based on the experimental data, a battery design for each battery and a set of at least one battery performance characteristic for each battery wherein each battery design comprises a value for each battery design parameter of a set of at least one battery design parameter. As such, each battery design may associate one or more battery design parameters, specifically values of battery design parameter(s) with corresponding performance characteristics.

The battery physical or chemical properties included in the experimental data may correspond to a plurality (e.g., hundreds) of battery design parameters. The experimental data may be obtained from experiments that are able to measure at the microscale of the battery design so that the battery parameters derived from the physical or chemical properties may include parameters of microstructure features of the battery such as the particle size distribution in the electrode. The measured particles may vary between tens nanometres to tens of micrometres ($\mu$m) in size. Some of these microscale features may be the result of different manufacturing processes and potentially may be unknown until measured under different manufacturing conditions.

The experimental data may undergo a pre-processing step to prepare the data for use as training data. For example, the data may be labelled to indicate the design parameter or performance characteristic it corresponds to, also the data may be labelled according to the type of parameter e.g. a time-series variable, a continuous variable or a categorical variable. The values of some design parameters may be inferred from the data. The machine learning model can automatically calculate the performance characteristics from the labelled values. For example, the measured values for current and voltage can be labelled as such and may be FIG. 8 is a flow diagram showing additional optional steps of the method of FIG. 7. After determining the battery designs and corresponding set of battery performance characteristics, the method 700 may further comprises an optional step 706 of storing, in at least one database, a plurality of battery designs and a corresponding set of one or more battery performance characteristics for each measured battery of the first plurality of batteries, wherein each design comprises a set of values of the determined set of battery design parameters associated with corresponding one or more performance characteristics.

Each design is stored with the corresponding set of at least one battery performance characteristics such that the battery performance characteristics or the data measured that characterises the performance for each battery design can be looked up and/or retrieved based on the battery or battery design. Thus the database is suitable for storing data used for the training and testing/validation of a machine learning model. The stored designs and performance characteristics may remain in the database indefinitely. Generally, the battery designs and performance characteristics may be stored any time after they have been determined. Further designs and performance characteristics determined based on experimental data measured from further batteries may be stored in the database at any point. For example, the database may be built up over time as experimental data becomes available. Also, the database may continue to store the data on it after a machine model has been trained to be used in the training of further machine learning models. By continuously updating the training data pool when more experimental data becomes available, a larger database may be built and from the larger range of training data, a larger number of parameters can be accurately incorporated into the machine learning model.

Method further comprises a step 708 of determining, based on the experiment data, coefficients of a physical and/or chemical model of the plurality of measured batteries. Physical/chemical models comprise equations that describe the physical and chemical behaviour of the batteries. These equations may relate the physical/chemical features of the battery, features which are the basis of the battery design parameters, to the performance of the battery. By performing experiments on the batteries in which the physical/chemical features are varied and the battery performance characteristics are measured, the coefficients of the equations which characterise the relationship between the features and the performance characteristic may be calculated. For example, a partial differential equation may be used to describe the transport of electrons in the solid matter phase and the transport of lithium ions in the liquid phase. The transport may be parametrised by particle size and volume fraction. The internal resistance of a battery may be calculated as a function of the electron/ion transport, charge transfer and other parameters. From the experimental data, the coefficients of the partial differential equation may be calculated in order to allow the partial differential equation to be used in a physics-based simulation to accurately derive the internal resistance from a given particle size and/or volume fraction. Some physicochemical model coefficients may be provided based on known coefficient values for the battery designs available in public domain databases. In step 710 at least one additional design and at least one additional set of at least one battery performance characteristic corresponding to the additional battery design is generated, wherein the at least one additional set of at least one battery performance characteristic is generated based on a physicochemical simulation of the at least one additional design, wherein the physicochemical simulation is based on the determined physical and/or chemical coefficients. Each of the additional designs and its corresponding set of simulated battery performance characteristics may be stored in the at least one database in optional step 712 of method 700.

The additional design may be generated artificially by assigning a value to each parameter of the set of battery design parameters. For example, where the battery design parameters includes the thickness of the electrodes and the range of values of the electrode thickness is 50-150 $\mu$m, generating the additional design comprises selecting an electrode thickness within the range 50-150 µm. Preferably a plurality of additional artificial designs are generated so that the additional artificial designs and the stored measured battery designs form a uniform distribution of values between the upper and lower limit of the values of the battery design parameters. Simulation of the additional design may be performed by using physics- and chemistry-based equations to simulate the battery performance characteristics that would be measured from the battery. The physicochemical simulation may be used to predict the battery performance characteristics from the design. The physicochemical simulation may be performed using open source (e.g. deal.II Finite Element Library) and/or commercial simulation software such as COMSOL™, Ansys™, Star-CCM+™ and similar which provides a framework for the physicochemical model equations. Simulating the additional battery performance characteristics may comprise simulating the physicochemical behaviour of particles in the battery at the microscale. Unlike simulation methods for battery designs already known in the art, the simulation is not limited to Doyle-Fuller-Newman model framework and the simulation model may be applied to microscale/particle level parameters. By simulating designs based on microscale feature parameters, higher levels of precision in the simulated performance characteristics may be achieved over techniques known in the art such as equivalent circuits or single particle models. The simulated data may be validated with either publicly available data and/or by experiments and tests. For example, the physicochemical models used to simulate the additional artificial designs may be validated by using them to model the measured battery designs and then comparing the battery performance characteristics generated by the physical/chemical model and the measured battery performance characteristics. Also, batteries may be manufactured according to some of the additional artificial designs and then the battery performance characteristics of those batteries made be measured and compared to the simulated battery performance characteristics.

By using physicochemical simulations to generate data, thousands of different cell configurations and their corresponding performance characteristics may be generated, far beyond what has previously been available in training databases. This additional data may be combined with the data derived from experiments to provide a larger training data pool. The total data pool comprising both the experimentally-derived design and performance samples and the simulated designs and performance samples may be randomly divided into a test set and a training set.

Because of the number of parameters and the physical modelling of the designs using physicochemical equations, the simulation has a greater level of accuracy and allows for greater control of the design than techniques previously known in the art. However, the time taken to perform the physicochemical simulations makes simulating the performance characteristics in this way ineffective for performing a search over the design space for a design with an optimal performance characteristic. By feeding the measured and artificial designs and the measured and simulated performance characteristics into the training of a machine learning model, the trained machine learning model may be used as the objective function of the search over the design space so that an optimum design for many parameters can be found with greater accuracy.

The coefficients of a physicochemical model that are determined as part of step 708 may be stored for use in simulations for training further machine learning models at a later time. As new experimental data is acquired, the coefficient values can be refined and more models for further design parameters may be added. This allows a database of coefficients to be built up over time to provide more accurate physicochemical simulations. This database may be used to provide the model coefficients for the generation of additional designs in step 710 to provide more accurate machine learning models when trained for predicting the performance characteristics.

Step 714 of method 700 comprises training a machine learning model by providing the determined designs and the at least one generated additional battery design to it as an input and fitting the output to the corresponding sets of battery performance characteristics such that the model is trained to predict the at least one battery performance characteristics from a battery design. Fitting can be performed through methods and techniques known in the art, for example, through the use of a loss function as a joint function of the output of the machine learning model and battery performance characteristic corresponding to the input battery design. Validation of the trained model, after being provided the training set of stored designs, may be performed using cross-validation and other techniques as known in the art with the test set of stored designs.

A variety of types of machine learning model may be used as the untrained model including, for example, random forest trees, backpropagation neural network, recurrent neural networks, convolutional neural network, XG boost, support vector machines, generalized additive models and other linear regressions. A model may be trained based on designs and characteristics derived from batteries of a particular type and/or industrial application. The hyperparameters of the model will thus be tuned according to the training data set which will be based on the specific type and/or industrial application of the battery and the predictive ability of the model for that type and/or application will be improved.

A model may also be trained using training data derived from experiments performed using a variety of battery materials and under different testing conditions. Alternatively, in some examples, the type of model for the machine learning model can be chosen based on the material, testing condition or application or other restricted class of battery. The model may be selected by training multiple models based on the training data derived from the restricted class of battery and then selecting the model which has the most accurate predictive ability.

The number of possible battery design parameters that may be determined from the experimental data for the battery design may be far larger than the number of design parameters that are actually relevant for manufacture of the battery. For example, the number of possible battery design parameters may number in the hundreds when the experimental data relates to physical and chemical properties of the battery that occur at the microscale. Even in other examples, a user may only want to look at a subset of possible battery design parameters for the battery design space, particularly when there is a particular one or more battery performance characteristics of interest. By training the machine learning model using a battery design of fewer dimensions, the machine learning model of higher dimensions may be more accurately trained on less data. It is thus desirable to be able to select the particular battery design parameters that are included in the set of battery design parameters based on the impact of the particular battery design parameter on the at least one battery performance characteristic of interest. However, this may need an understanding of the relationship between the battery design parameters and the battery performance characteristics.

The method 700 may further comprise determining the set of battery design parameters based on the correlations between each battery design parameter of a larger set of battery design parameters and the at least one battery performance characteristic. The correlations may be determined during training of the machine learning model. This allows for the determining to use the correlations that are learned by the machine learning model during the training methods described in connection to method 700.

For example, during the training of the machine learning model to predict the at least one battery performance characteristic from a battery design, there may be a first stage where the machine learning model is provided, as inputs, a plurality of battery designs comprising values for each parameter of a greater set of battery design parameters. The greater set of battery design parameters may comprise, for example, the possibly hundreds of electrochemical microscale properties of the battery or, of course, fewer properties. There are techniques and methods known in the art for generating a correlation table between the one or more inputs of a machine learning model and the output of a machine learning model during the training of the machine learning model to infer the output from the inputs.

A correlation table may be produced at the end of the first training stage which contains information that describes the relationship between the battery design parameters and the battery performance characteristics. For example, the correlation table may contain the correlation coefficients for the correlation between each of the battery design parameters and may also show the sensitivity/correlation of each design parameter to the battery performance characteristics. The correlation table may in some examples be selectively produced for only a first subset of the greater set of battery design parameters wherein the first subset of battery design parameters comprises a user-selected set of battery design parameters. The user-selected set may be a substantially smaller set, e.g. only 20 battery design parameters compared to the thousands, that are of interest to the user because they are relevant to a particular method of manufacturing batteries or to a particular application of the batteries. The correlation table may be used to determine a smaller subset (that is a second subset if a first subset has been selected by a user) of battery design parameters which may be used to parametrise the battery designs that are input to the machine learning model during a second training stage. For example, the correlation table may be used to determine that there is a low correlation between a battery design parameter and a battery performance characteristic to be targeted and so that low correlation design parameter is excluded from the smaller subset of battery design parameters. Also, some battery design parameters may be highly correlated such that the values of one during manufacture will dictate the value of another. If a strong correlation is found between two design parameters, a dependence functions can be added, based on the correlations between the possible pairs of values contained in the correlation table, during the training of the machine learning model making the model more accurate. During the second stage of training, the battery design parameters provided as an input to the machine learning model only need to comprise values for each design parameter of the smaller set of battery design parameters such that the machine learning model is trained to predict the at least one battery performance characteristic from a battery design comprising a value for each design parameter of the smaller subset of battery design parameters.

The experimental data may comprise a plurality of sets of at least one image scan of each battery from a subset of the first plurality of batteries. In some examples, where the experimental data may be 2D or 3D images such as image scans from secondary electron microscopy, x-ray tomography, optical microscopy or other approaches known in the art, of the battery design structure, it is possible to extract battery design parameters from the images. The images can therefore be used as inputs to be used for training the machine learning model to predict battery performance characteristics from battery design parameters.

The first plurality of batteries may comprise a second plurality and a third plurality of batteries and the experimental data comprises a plurality of sets of at least one image scan of each battery of the second plurality and the third plurality of batteries. In order to extract battery designs from the images, a machine learning model may be used to infer the values of the battery design parameters from the image. The battery design parameter values of the second plurality of images may be determined. For example, the values may be determined by performing a pre-processing of the images to determine the information about the battery design parameters contained in the images or the second plurality of batteries may be ones for which there is other experimental data from which the values may be determined. The machine learning model is trained to infer a set of values for a set of design parameters of a battery from an image of the battery wherein training the model comprises providing the sets of images of the second plurality of the batteries to the model as an input and fitting the output to the set of parameter values of the corresponding battery for each of the set of images. The model trained to infer the battery design values from the images preferably may be the same model as the one trained to infer the at least one battery performance characteristic from a set of values of a set of battery design parameters.

In one example, the method 700, prior to training the model by providing the stored designs to it, further comprises a step (not shown in FIG. 7) of training the model to infer the battery design of a battery from the images of the battery wherein training the model to infer the design from an image comprises providing each set of image scans of the second plurality of batteries to the model as an input and fitting the output to the determined battery design parameter values of the corresponding battery. The fitting of values for training and further step of testing and validation of the model for predicting design parameter values for images may also be performed using techniques as known in the art. After training the machine learning model to infer battery design parameter values from images, the same machine learning model is trained to infer one or more battery performance characteristics from battery designs including from battery designs that are provided as images taken from scans of a battery. This may be done by, as part of the step 704 of determining the battery design for each battery, selecting the set of image scans of each battery of the second and third pluralities of batteries as the battery design of the corresponding battery. The sets of images scans will thus be stored as the battery design. The images may be provided to the machine learning model as training and test data when training the model. Therefore, the step 714 of method 700 of training the machine learning model to predict the at least one battery performance characteristics from a battery design may comprise training the machine learning model by providing the sets of image scans stored as battery designs to it as an input and fitting the output to the corresponding battery performance characteristic.

By first training the model to receiving images as an input and to output the parameter values of the design, the parameters of the machine model will be first adapted to fit values that are shared or close to values required for the later task of receiving images as input and outputting the battery performance characteristics. The design parameter values are only required for this first training and so the values do not have to be determined separately for the batteries of the third plurality of batteries. Thus, the experimental data used to train the machine learning model to predict battery performance characteristics may be expanded by just acquiring image scans of batteries. Being able to provide images as battery design inputs to the machine learning model allows for additional methods for acquiring battery designs as part of the experimental data and thus allows for acquisition of larger databases of training data to be easier.

Thus, after both training steps, the trained machine learning model may then infer at least one battery performance characteristic from an image scan of a battery.

In some examples, before using the images as part of the training data in step 714, the images may be pre-processed. This may be done as part of step 704. It may also be done on the images to be used as part of the step of training the model to infer the battery design of a battery from the images of the battery. The image pre-processing may include segmentation of the image. This may be performed using a machine learning model based auto segmentation method, as known in the art, for example using a simple neural network.

The images may require additional pre-processing to improve the quality of the images to be suitable for extracting microscopic structural features such as porosity, particle sizes, active material/binder volume fractions etc. Since most materials are anisotropic, high-resolution 3D images are required to analyse the key microstructural metrics. However, 3D image data with high resolution i.e. resolution suitable to measure the battery microstructure at a micron and submicron level, is challenging to obtain from the laboratory (low resolution in this case would be from a few microns to few tens of microns). 2D imaging techniques tend to be faster, with higher resolution, and more suitable for image segmentation, different phase identification and may be more widely available. The image pre-processing may include generating high resolution 3D images from 2D images.

In some examples, there may be only 2D images available. If these images comprise an image of each of a plurality of views of the battery (for example, the top view, front view and lateral view), a large number of smaller images may be cropped from the available 2D images in the experimental data wherein each cropped image shows a subsection of the battery from one of the plurality of views, with at least one image for each view for each subsection. A generative adversarial network (GAN) can be trained to generate 3D image data. In one example, the subsampled cropped images will be used to train the GAN model to obtain discriminators for each view, for example, three discriminators trained at the x, y, and z axes, and an image generator. The image generator may be used to synthesize the 3D image according to the initial 2D images. In other examples, there may be 3D images but the quality of the scan is low, for example, the resolution is low. The image pre-processing may include generating high resolution 3D images from low resolution 3D images. For example, the GAN may be trained to use high resolution 2D cropped images of the battery subsections and the low resolution 3D image as the source to carry out deconvolution calculations. This will also obtain as per the earlier example, three discriminators trained at the x, y and z axes and one image generator and the image generator may be used to synthesize the missing microstructural features to increase the resolution of the raw low resolution 3D image data. The synthetic images generated by the GAN may be validated using the raw image data by comparing the statistical electrochemical properties, such as the volume fractions of each phase, relative surface area and relative diffusivities etc.

Being able to provide images as battery design inputs to the machine learning model allows for additional methods for acquiring battery designs as part of the experimental data and thus allows for acquisition of larger databases of training data to be easier.

A machine learning model may also be trained to infer parameter values that are missing from a battery design. This may be a separate machine learning model from the machine learning model that is trained to predict the battery performance characteristics from a battery design. However, because of the overlap in machine parameters, it is more efficient and more accurate to train the same machine learning model as is used for predicting to infer missing parameter values from a battery design. This may be done either prior to or as an intermediate stage of training the machine learning model to predict battery performance characteristics from battery designs. Therefore method 700 may also comprise training the machine learning model to infer the value for at least one battery design parameter of a set of battery design parameters that does not have a corresponding value in a set of values comprising a value for each battery design parameter of a subset of the set of battery design parameters i.e. training the machine learning model to infer missing values from a set of values for a set of battery design parameters. Training the machine learning model to infer missing values comprises a step of generating a plurality of incomplete battery designs comprising values for each parameter of a set of battery design parameters except for at least one arbitrary missing parameter of the set of battery design parameters.

For each incomplete battery design used as input training data, the corresponding battery design with a value for each parameter of the set of battery design parameters should be known. An incomplete battery design may be generated, in some cases, by removing at least one parameter value from the set of battery design parameter values of a battery design that has been determined based on the experimental data.

An incomplete battery design may also be generated by assigning a value to each battery design parameter of the set of battery design parameters except for at least one missing parameter and then generating a corresponding battery design based on the correlations between the battery design parameters. For example, the correlation table produced by the machine learning model during training may be used to determine the distribution of possible values for the missing design parameter value based on the other assigned design parameter values of the set.

The method 700 may then further comprise a step of training the machine learning model by providing the plurality of incomplete battery designs as an input to the machine learning model and fitting at least one output of the machine learning model to the missing parameter value such that the model is trained to predict at least one missing parameter value from an incomplete battery design, for any arbitrary missing parameter, and wherein the machine learning model is also trained to output a confidence interval for the at least one missing parameter value.

The machine learning model will be able to predict any arbitrary missing parameter value for a given level of confidence if the plurality of incomplete battery designs used as input training data comprises a sufficient number of incomplete designs for each possible missing parameter value.

For example, the machine learning model may be provided an incomplete battery design as an input. The output of the machine learning model may then be fitted to the corresponding battery design which includes the missing design parameter. There are also architectures and techniques for machine learning models which are known in the art for being able to produce a confidence interval for the output.

The method 700 may then further comprise a step of determining, based on the experimental data, at least one further incomplete battery design of a battery of the plurality of batteries and the at least one corresponding battery performance characteristic of the battery. For example, the incomplete design may be determined from the experimental data based on measurements of the physical and chemical properties of a battery, just like other designs based on experimental data, but the measurements were missing data or at least data of a high enough quality to represent the missing design parameter. For example, the missing information may not have been captured by experimental data used to build the initial design or the data may have provided a low level of confidence in the measured parameter or otherwise have been a poor quality measure of the design parameter. For example, when the design is based on an image scan, the image may not have been of sufficient quality or resolution to capture certain details. In particular, structural details such as material porosity before and after the calendering process (compression of the electrodes to adjust porosity), particle size distribution, and different fractions of active materials, binders, pores, etc. in the battery material are very difficult to measure and likely to be missing.

The method 700 then further comprises a step of generating at least one inferred complete battery design by providing the at least one further incomplete battery design to the trained machine learning model wherein the at least one inferred complete battery design comprises the at least one incomplete battery design and the corresponding missing parameter value output by the machine learning model. The machine learning model will also provide the confidence interval for the corresponding missing parameter value.

For example, experimental data may be acquired for a battery which does not have data for the mean pore diameter of the current collectors. For instance, maybe the data required image scans which were not at a high enough resolution to measure the pores or perhaps the information was excluded from the experimental data because the confidence in the measurement was low. A design is determined based on the data for the battery except for the porosity. In this example, this incomplete design can be provided to the machine learning model which outputs an inferred value of 10 μm with a confidence of 95% that the mean pore diameter lies within +2 μm.

The method 700 may then further comprise a step of determining, based on the output confidence interval corresponding to the at least one inferred complete battery design, whether the inferred complete battery design is suitable for use as input for training a machine learning model to predict battery performance characteristics. For example, if the incomplete design was missing a parameter value for the mean pore diameter of the current collectors, and the inferred value of the mean pore diameter was 10 μm with a confidence of 95% that the mean pore diameter lies within +2 μm, then the relative size of the 95% confidence interval can be compared to the inferred value and if it is below a threshold, the inferred value is determined to be accurate enough to use as a training input for the training of the machine learning model to predict battery performance characteristics from a battery design. After an inferred complete battery design has been determined to be suitable, training the machine learning model to predict the at least one battery performance characteristic from a battery design may comprise providing at least one suitable inferred completed battery design to it as an input and fitting the output to the corresponding at least one battery performance characteristic. This allows for a larger proportion of possible battery designs that can be determined from the experimental data to be used as training inputs since data which otherwise would not be good enough to provide a complete battery design may now be used and the information contained about the other design parameters is not wasted.

FIG. 9 is a flowchart showing steps of an exemplary method 900 of training machine learning models for predicting performance of battery designs in accordance with embodiments of the present invention.

The method 900 may be executed, for example, by system 1100 described herein after, for training one or more machine learning (ML) models such as, for example, the machine learning model 615 of FIG. 6 and/or one or more other models suitable for use in methods 100 and/or 1000.

The ML models may include one or more models as known in the art, for example, a neural network, such as for example, a CNN, an RNN, a DNN, and/or the like, a classifier, an SVM and/or the like.

The method 900 comprises a step 902 of obtaining experimental data measured from each battery of a plurality of batteries as described in step 702 of the process 700. As described herein before, the experimental data comprises data measured based on at least one of a plurality of physical and chemical properties of each of the plurality of batteries and further comprises data characterising battery performance.

In particular, the experimental data measured for the plurality of batteries may comprise values one or more physical and chemical properties of each battery and one or more corresponding performance characteristics thus defining relations between physical and chemical properties and corresponding performance characteristics.

The performance characteristics may be expressed in one or more of a plurality of performance metrics, for example, an overall power capacity, a volumetric power capacity, a gravimetric power capacity, an overall energy capacity, a volumetric energy capacity, a gravimetric energy capacity, a voltage, a current, an internal resistance, a size, a weight, a temperature, a longevity, and/or a cost, and/or the like.

The method 900 comprises a step 904 of constructing one or more battery physical and/or chemical models using the experimental data measured for each of the plurality of batteries.

As described in step 708 of the process 700, the physical and/or chemical models may be constructed by determining their coefficients based on the experiment data. The physical and/or chemical models may comprise equations describing the physical and chemical behaviour of the batteries. These equations may be computed, derives, and/or otherwise determined based on the experimental data correlating values of design parameters with corresponding performance characteristics.

The method 900 comprises a step 906 of conducting a plurality of simulations based on one or more of the physical and/or chemical models.

Each of the plurality of simulations, interchangeably designated physicochemical simulations, may be conducted by selecting and/or setting values for a respective set comprising one or more battery design parameters within a range of values defined for the respective battery design parameter.

The battery design parameters may comprise a plurality of parameters relating to the design of a battery, for example, an electrode dimension (e.g., thickness, length, width, etc.), a porosity, a material composition, and/or the like.

The simulations may be conducted to simulate physical and/or chemical behaviour of each of the plurality of simulated batteries based on the physical and/or chemical models in which the physical and/or chemical properties of a simulated battery are defined by the (values of) selected and/or set for the respective set of battery design parameter(s) in a respective battery design.

Specifically, the simulations may be conducted to estimate, predict and/or determine a performance of each of the plurality of simulated batteries defined by the battery design parameter(s) of its respective battery design.

Optionally, as described herein before, one or more of the plurality of battery designs may comprise a 3D design of battery current collectors.

Preferably, simulating the battery designs comprises simulating the physical and/or chemical behaviour of particles in the battery at the microscale.

Optionally, as described herein before, one or more of the plurality of battery design parameters may be correlated with one or more other battery design parameters.

The method 900 comprises a step 908 of extracting a plurality of battery design parameters and corresponding performance characteristics from the plurality of simulations. As such, a plurality of battery design parameters may be correlated with corresponding performance characteristics determined based on the simulations of the physical and/or chemical model(s).

The method 900 comprises a step 910 of generating a plurality of training samples based on the extracted battery design parameters and their corresponding performance characteristics. Each of the training samples may therefore associate one or more battery design parameters with one or more corresponding performance characteristics.

For example, the training samples may be generated by labelling each set of battery design parameters of each simulated battery design with a label indicative of the performance characteristic(s) estimated, predicted and/or determined during simulation of the simulated battery design.

Optionally, one or more of the training samples may be generated based on the experimental data, i.e., based on battery design parameters and corresponding performance characteristics measured for the plurality of (actual) batteries rather than based on battery design parameters and performance characteristics extracted from simulated data.

Optionally, one or more of the training samples may comprise one or more images of one or more batteries from which one or more battery design parameters may be derived.

The method 900 comprises a step 912 of using the plurality of training samples for training one or more ML models. The ML model(s) may be trained to create a plurality of battery designs and compute an estimated performance score for each of these battery designs.

Each of the plurality of battery designs may be created by defining value(s) for a respective set of battery design parameter(s) selected and/or set for the respective battery design within the range defined for the respective parameter.

Optionally, one or more of the battery designs may be created by selecting a deviating value for one or more battery design parameter of a respective set of the respective battery design which is outside the respective range defined for the respective battery design parameter(s).

Optionally, as described herein before, the ML model(s) may be further adapted to apply interpolation for computing the performance score of one or more of the battery designs defined by a respective set comprising a deviating value for one or more battery design parameter of its respective set.

Optionally, since some of the battery design parameters may be correlated with other battery design parameters, the ML model(s) may be further trained to adjust one or more sets of battery design parameters defining one or more respective battery designs according to a correlation between the correlated battery design parameters.

Correlation between battery design parameter may be retrieved, for example, from one or more correlation tables, as described herein before which may comprise correlation information indicative of interaction between battery design parameters and/or impact of one or more battery design parameters on one or more other battery design parameters.

Optionally, the ML model(s) may be further trained to estimate a sensitivity of at least some of the plurality of battery designs to a variation in the value of one or more battery design parameter of the respective set defining the respective battery design.

The sensitivity estimated for a respective battery design may be evaluated by the ML model(s) which may adjust accordingly the estimated performance score computed for the respective battery design since the sensitivity may impact the estimated performance score. For example, the ML model(s) may decrease the estimated performance score computed for a respective battery design in case the respective battery design is estimated to be highly sensitive to variations in the values of its battery design parameters. Complementary, the ML model(s) may increase the estimated performance score computed for a respective battery design in case the respective battery design is estimated to be robust and highly immune to variations in the values of its battery design parameters.

Optionally, the ML model(s) may be further trained to add battery design parameters missing in one or more battery designs, select value(s) for the missing battery design parameter(s) and compute an estimated performance score for the complemented battery designs.

The ML model(s) may include, in the respective set of parameters of one or more of the plurality of battery designs, one or more missing battery design parameters which are not initially included in the respective set. The ML model(s) may then select a value for each of the added missing battery design parameters from the respective range defined by the respective missing battery design parameter, and compute an estimated performance score for the respective battery design defined by the complemented set.

Optionally, the ML model(s) may be further trained to compute a certainty score for each missing battery design parameter which is indicative of a level of certainty and/or uncertainty in the value selected for the respective missing battery design parameter. The certainty score may be used to evaluate whether to select different values for one or more low confidence missing parameters added to define one or more of the battery designs and compute an updated estimated performance score accordingly.

Optionally, the ML model(s) may be further trained to compute a confidence score for one or more of the battery designs which is indicative of a confidence in the estimated performance score computed for the respective battery design. The confidence score may be used to evaluate reliability, and/or integrity of one or more of the battery designs and decide whether to select it or not. For example, high confidence battery designs may be estimated to be more reliable, and vice versa, low confidence battery designs may be estimated to be less reliable.

Optionally, the ML model(s) may be further trained to infer one or more battery design parameters of one or more of the training samples from one or more images of one or more batteries included in the respective training sample. This means that rather than extracting numeral values from one or more training samples, the ML model(s) may be trained to extract, and/or infer values of one or more battery design parameters relating to one or more batteries from one or more training samples comprising one or more images of the respective battery. For example, the ML model(s) may be trained to infer one or more dimensions of one or more features and/or elements of a respective battery, for example, a weight, a thickness of a current collector, a porosity, an/or the like from one or more images of the respective battery, The method 900 comprises a step 914 of outputting the trained ML model(s) which may be used for predicting performance of a plurality of battery designs.

For example, the system 1100 may transmit the trained ML model(s) to the system 600 over the network via the I/O interface 1130. In another example, the system 1100 may store the trained ML model(s) in one or more attachable storage devices (e.g., USB memory stick, etc.) attached to the I/O interface 1130. The attachable storage device may be then removed and provided to the system 600 which may retrieve the trained ML model(s) for future use.

Figure 10:
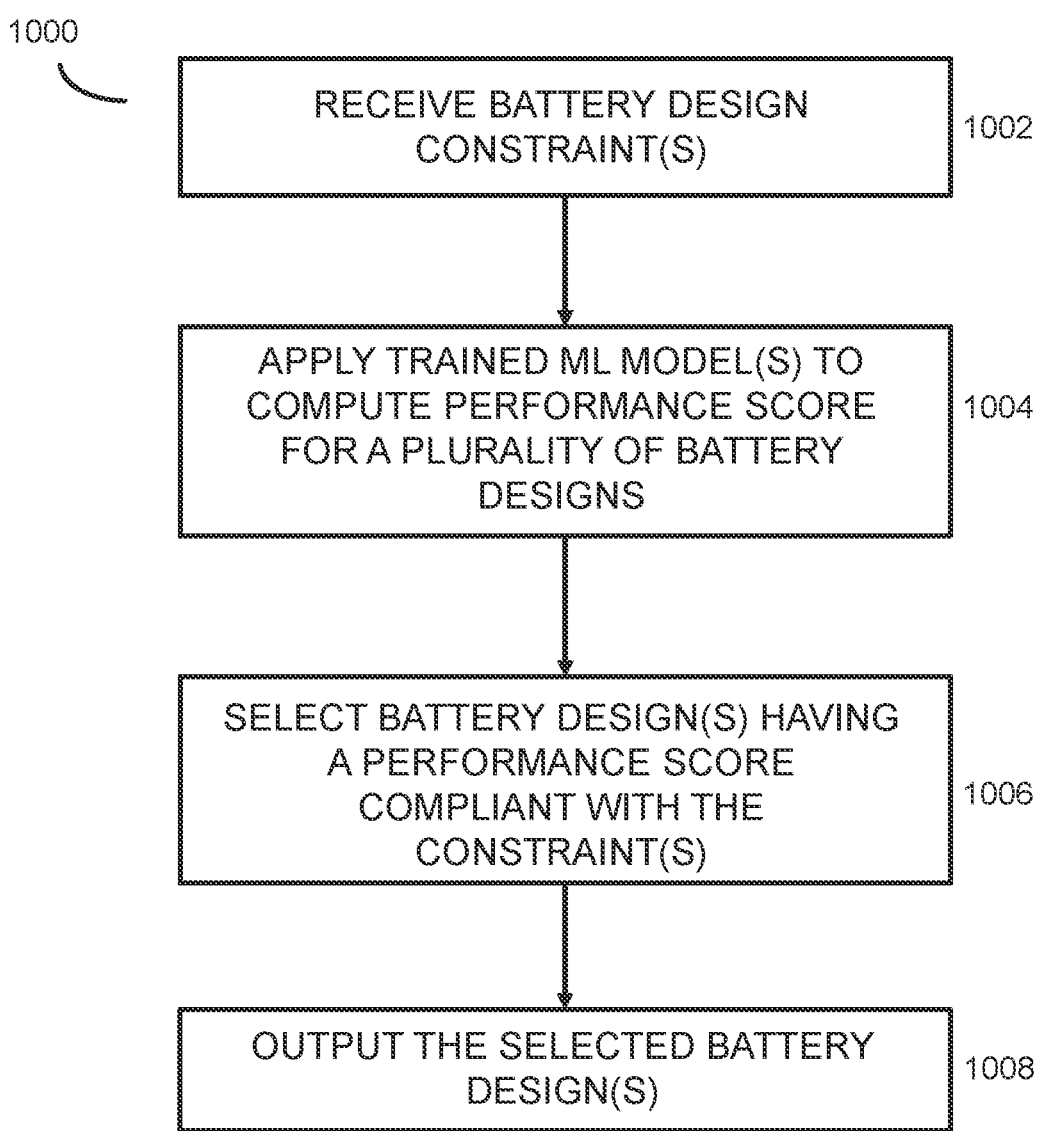
FIG. 10 is a flowchart showing steps of an exemplary method of selecting battery designs using machine learning models trained to predict performance of battery designs in accordance with embodiments of the present invention.

FIG. 10 is a flowchart showing steps of an exemplary method 1000 of selecting battery designs using machine learning models trained to predict performance of battery designs in accordance with embodiments of the present invention.

The method 1000 may be executed, for example, by system 600 of FIG. 6, for selecting battery designs using trained ML models such as, for example, the machine learning model 615 of FIG. 6 and/or one or more other models suitable for use in methods 100 and/or 1000.

The method 1000 comprises a step 1002 of receiving one or more design constraints for a battery design as described in steps 102 and 401 of the method 100.

As described herein before, the design constraint(s) may define one or more battery design parameters and one or more performance characteristics. In particular, the design constraint(s) may define values for one or more of the battery design parameters and a value of the performance characteristic(s) which, as described herein before, may be expressed using one or more performance metrics. As also described herein before, each of the plurality of battery design parameters defines a respective range of values from which values of the respective battery design parameter may be selected.

Optionally, one or more of the design constraints may define a plurality of performance characteristics each weighted with a respective weight indicative of its priority.

For example, one or more performance characteristics may define a first performance characteristic, for example, power capacity, may be assigned a first weight, and a second performance characteristic, for example, battery cell size, may be assigned a second weight smaller than the first weight. As such, when optimizing the battery designs to comply with the design constraint(s) as described herein after, the power capacity may have priority over the battery cell size.

The method 1000 comprises a step 1004 of applying one or more of the ML model trained according to the process 900, for example, the machine learning model 615 and/or other models to compute an estimated performance score for each of a plurality of battery designs each defined by values of a set of battery design parameters selected from a plurality of battery design parameters, where the value of each of the plurality of battery design parameters is within a respective range defined for the respective battery design parameter.

The method 1000 comprises a step 1006 of selecting one or more of the plurality of battery designs evaluated by the trained machine learning model(s) which has an estimated performance score compliant with the design constraint(s).

Optionally, since, as described herein before, one or more battery design parameters may be correlated with one or more other battery design parameters, selection of the battery design(s) may be adjusted according to a correlation between at least one some battery design parameters of one or more of the evaluated battery designs.

The method 1000 comprises a step 1008 of outputting the selected battery design(s) which may be used for manufacturing one or more batteries according to the respective selected battery design.

For example, the system 600 may output one or more records describing the selected battery design(s). For example, the system 600 may output, for example, via the I/O interface 630, one or more models, for example, a 2D model, a 3D model, and/or the like of the selected battery design(s) and/or part thereof, for example, of the current collectors. In another example, the system may output one or more tables, lists, and/or files describing values of the battery design parameters of the selected battery design(s). In another example, the system 600 may present the selected battery design(s) and/or part thereof to one or more users, for example, via the user interface 640.

Figure 11:
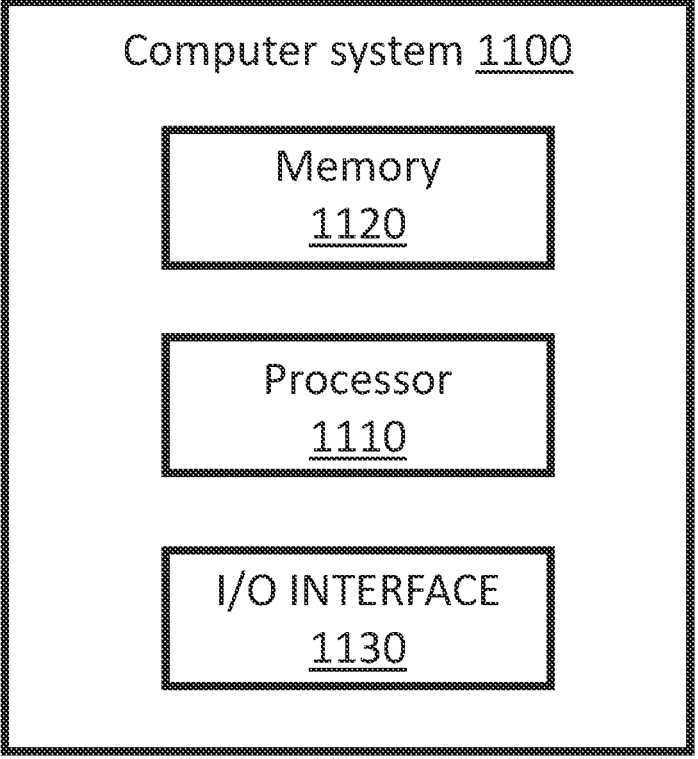
FIG. 11 is a component diagram of a computer system suitable for the operation of embodiments of the present invention.

FIG. 11 is a component diagram of a computer system 1100 suitable for the operation of embodiments of the present invention.

An exemplary system 1100, for example, a computer, a server, a computing node, and/or the like may perform one or more of the methods described herein that correspond to embodiments of the present invention. System 1100 may comprises a processor 1110, a memory 1120, and an I/O interface 1130.

Memory 1120 may store computer program code or computer executable instructions that when executed by one or more processors such as, for example, the processor 1110 causes the processor 1110 to carry out one or more of the methods described herein. In some examples the processor 1110 may comprise one or more processors, each of which may perform steps of one or more of the method as described herein. The system 1100 may comprise in the memory 1120 or be communicatively coupled to a machine learning model, for example, via the I/O interface 1130 such that the system 1100 may provide an input to and receive an output from the machine learning model. The machine learning model may be the trained machine learning model 615 of FIG. 6 for performing the method 100 of FIG. 1. Alternatively, the machine learning model may be an trained by performing the method 700 of FIG. 7 and/or the method 900 of FIG. 9.

The I/O interface 1130 may include one or more wired and/or wireless I/O interfaces, ports and/or interconnections, for example, a USB port, a BT interface, an RF interface, and/or the like. In another example, the I/O interface 1130 may include one or more wired and/or wireless network interfaces for connecting to one or more wired and/or wireless networks, for example, a LAN, a WLAN (e.g. Wi-Fi), a WAN, a MAN, a cellular network, the internet and/or the like.

Via the I/O interface 1130, the system 1100 may communicate with one or more external devices. For example, when executing processes 700 or 900, via the I/O interface 1130, the system 1100 may receive one or more datasets comprising training samples for training one or more ML models to predict performance of battery designs and/or output one or more trained ML models which may be applied for predicting performance of battery designs.

The processor(s) 1110, homogenous or heterogeneous, may include one or more processing nodes arranged for parallel processing, as clusters and/or as one or more multi core processor(s). The memory 1120 may include one or more non-transitory memory devices, either persistent non-volatile devices, for example, a ROM, a Flash array, a hard drive, an SSD, and/or the like as well as one or more volatile devices, for example, a RAM device, a cache memory and/or the like. The memory 1120 may further include one or more storage systems, for example, a database, a file system, and/or the like. Optionally, the memory 1120 may include one or more remote storage resources accessible via the I/O interface 1130, for example, a Network Attached Storage (NAS), a storage server, a remote database, a cloud storage service, and/or the like.

The processor(s) 1110 may execute one or more software modules, for example, a process, a script, an application, an agent, a utility, a tool, an Operating System (OS), a service, a plug-in, an add-on and/or the like each comprising a plurality of program instructions stored in a non-transitory medium (program store) such as the memory 1120 and executed by one or more processors such as the processor(s) 1110.

Optionally, the processor(s) 1110 may include, utilize and/or apply one or more hardware elements available in a formworks positioning system, for example, a component, an Integrated Circuit (IC), an Application Specific IC (ASIC), a Field Programmable Gate Array (FPGA), a Digital Signals Processor (DSP), a Graphic Processing Unit (GPU), an Artificial Intelligence (AI) accelerator, and/or the like.

The processor(s) 1110 may therefore execute one or more functional modules utilized by one or more software modules, one or more of the hardware modules and/or a combination thereof for executing one or more of the processes 700, 900, and/or 1000. While in practice the processor(s) 1110 may execute one or more functional modules for executing the processes 700, 900, and/or 1000, for brevity the system 1110 is described to execute these processes.

Optionally, the system 1110 may be provided, executed and/or utilized at least partially by one or more cloud computing services, for example, Infrastructure as a Service (IaaS), Platform as a Service (PaaS), Software as a Service (SaaS), and/or the like provided by one or more cloud services, cloud infrastructures, and/or the like such as, for example, Google Cloud, Microsoft Azure, Amazon Web Service (AWS) and Elastic Compute Cloud (EC2), IBM Cloud, and/or the like.

Insofar as embodiments described are implementable, at least in part, using a programmable processing device, such a microprocessor, digital signal processor or other processing device, data processing apparatus or system, it will be appreciated that computer readable instructions for configuring a programmable device, apparatus or system to implement the foregoing described methods is envisaged as an aspect of the present invention. The computer readable instructions may be embodied as computer program code such as source code or may undergo compilation for implementation on a processing device, apparatus or system or may be embodied as object code, for example.

Suitably, the instructions are stored on a non-transitory carrier medium in machine or device readable form, such as in the form of a computer readable medium. In examples, the medium can be one or more of a solid-state memory, magnetic memory such as disk or tape, optically or magneto-optically readable memory such as compact disk or digital versatile disk etc., and the processing device utilises the program or a part thereof to configure it for operation. The computer program may be supplied from a remote source embodied in a communications medium such as an electronic signal, radio frequency carrier wave or optical carrier wave. Such carrier media are also envisaged.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant systems, methods and computer programs will be developed and the scope of the terms machine learning model, physical model and chemical model are intended to include all such new technologies a priori.

As used herein the term "about" refers to +10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, an instance or an illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of selecting battery designs using machine learning (ML) models, comprising:
receiving at least one design constraint for a battery design defining at least one of a plurality of battery design parameters and at least one performance characteristic, wherein each of the plurality of battery design parameters defines a respective range of values, and wherein the at least one design constraint comprises at least one limitation or precision level of a manufacturing process for the designed battery;

applying at least one trained ML model to compute an estimated performance score for each of a plurality of battery designs, wherein each of the plurality of battery designs is defined by values of a set of battery design parameters selected from a plurality of battery design parameters, and a value of each of the plurality of battery design parameters is within the respective range;
selecting at least one of the plurality of battery designs having an estimated performance score compliant with the at least one design constraint;
adjusting the selection according to a correlation between at least two battery design parameters of the plurality of battery design parameters;
outputting the selected at least one of the plurality of battery designs; and
manufacturing at least one battery according to the selected at least one of the plurality of battery designs.

2. The method of claim 1, wherein the at least one design constraint defines a plurality of performance characteristics each weighted with a respective weight indicative of its priority.

3. The method of claim 1, wherein the at least one ML model is trained using a plurality of training samples each associating at least one of the plurality of battery design parameters and with at least one corresponding performance characteristic extracted from a plurality of simulations conducted based on at least one battery physical and/or chemical model constructed using experimental data measured for each of a plurality of batteries.

4. The method of claim 1, wherein the at least one performance characteristic is selected from the group consisting of:
energy density;
specific energy;
power density;
specific power;
cycle life;
capacity retention;
internal resistance;
temperature increase under different C-rates, and
cycling voltage changes under different C-rates.

5. The method of claim 4, wherein the at least one performance characteristic is a plurality of performance characteristics, the plurality of performance characteristics comprising:
cycle life; and
internal resistance.

6. The method of claim 5, wherein the plurality of performance characteristics further comprises capacity retention.

7. The method of claim 6, wherein the plurality of performance characteristics further comprises temperature increase under different C-rates.

8. The method of claim 1, wherein at least one of the plurality of battery designs comprises a 3-dimensional (3D) design of battery current collectors.

9. The method of claim 8, wherein the plurality of battery design parameters comprise at least one of a thickness of an anode or cathode current collector, a spatial frequency of variations in a shape of a current collector, a phase shift between different variations of different current collectors in the battery, and amplitude of variations in a shape of a current collector, a current collector porosity, and a 3-dimensional (3D) current collector microstructure.

10. The method of claim 1, wherein the plurality of battery design parameters comprise at least one of an electrolyte volume fraction, active material volume fraction, binder volume fraction, electrode thickness, particle size distribution and particle shape distribution.

\* \* \* \* \*